US012620781B1

(12) United States Patent
Qaid et al.

(10) Patent No.: US 12,620,781 B1
(45) Date of Patent: May 5, 2026

(54) PEROVSKITE-BASED WHITE OR MULTI-WAVELENGTH LASER

(71) Applicant: KING SAUD UNIVERSITY, Riyadh (SA)

(72) Inventors: Saif Mabkhot Qaid, Riyadh (SA); Sanad Abdullah Alsulaiman, Riyadh (SA); Abdullah Saleh Aldwayyan, Riyadh (SA)

(73) Assignee: KING SAUD UNIVERSITY, Riyadh (SA)

( * ) Notice: Subject to any disclaimer, the term of this patent is extended or adjusted under 35 U.S.C. 154(b) by 0 days.

(21) Appl. No.: 19/416,039

(22) Filed: Dec. 11, 2025

Related U.S. Application Data

(62) Division of application No. 19/350,268, filed on Oct. 6, 2025.

(51) Int. Cl.
H01S 5/36 (2006.01)
C23C 14/24 (2006.01)
(Continued)

(52) U.S. Cl.
CPC .............. H01S 5/36 (2013.01); C23C 14/24 (2013.01); C23C 14/5806 (2013.01); H01S 5/321 (2013.01)

(58) Field of Classification Search
CPC ...... H10H 20/012–0125; H10H 20/823–8232; H01S 5/36; H01S 5/3022; H01S 5/3222; C23C 14/24–325
See application file for complete search history.

(56) References Cited

U.S. PATENT DOCUMENTS

2020/0332408 A1* 10/2020 Irwin .................... C23C 14/088
2021/0122976 A1 4/2021 Naito et al.
(Continued)

FOREIGN PATENT DOCUMENTS

CN 114695669 A 7/2022

OTHER PUBLICATIONS

Tang, et al., "All-inorganic perovskite CsPb(Br/I)3 nanorods for optoelectronic application"; Nanoscale, 2016, 8, 15158-15161, https://doi.org/10.1039/C6NR01828A. (Abstract).
(Continued)

*Primary Examiner* — Steven B Gauthier
*Assistant Examiner* — Candice Chan
(74) *Attorney, Agent, or Firm* — Nath, Goldberg & Meyer; Joshua B. Goldberg

(57) ABSTRACT
A method for manufacturing an optoelectronic device using halide perovskite layers includes providing a substrate; optionally depositing a first spacer layer on the substrate; depositing a first emission layer on the first spacer layer, if present, or on the substrate; depositing a second spacer layer on the first emission layer, depositing a second emission layer on the second spacer layer; optionally depositing a third spacer layer on the second emission layer; optionally depositing a third emission layer on the third spacer layer, if present; optionally depositing a fourth spacer layer on the third emission layer, if present; wherein the first emission layer, the second emission layer, and the third emission layer comprise a halide perovskite layer, and wherein the halide perovskite layer of the first emission layer, the second emission layer, and the third emission layer each comprises a three-dimensional halide perovskite, a two-dimensional halide perovskite, or a combination thereof.

6 Claims, 12 Drawing Sheets

(51) Int. Cl.
　　C23C 14/58 (2006.01)
　　H01S 5/32 (2006.01)

(56) References Cited

U.S. PATENT DOCUMENTS

| | | |
|---|---|---|
| 2021/0210707 A1 | 7/2021 | Levermore |
| 2021/0296618 A1* | 9/2021 | Levermore ......... H10K 50/125 |
| 2022/0077933 A1 | 3/2022 | Ooi et al. |

OTHER PUBLICATIONS

Quan, et al., "Highly Emissive Green Perovskite Nanocrystals in a Solid State Crystalline Matrix"; Adv. Mater. 2017, 1605945, DOI: 10.1002/adma.201605945.

Chenna, et al., "Perovskite white light emitting diodes: A review"; Materials Today Electronics vol. 5, Sep. 2023, 100057.

Chen, et al., "Rapid large-scale synthesis of highly emissive solid-state metal halide perovskite quantum dots across the full visible spectrum"; Optics & Laser Technology vol. 143, Nov. 2021, 107369 (Abstract).

Veldhuis, et al., "Perovskite Materials for Light-Emitting Diodes and Lasers"; Advanced Materials, vol. 28, Issue32, Aug. 24, 2016, pp. 6804-6834, https://doi.org/10.1002/adma.201600669. (Abstract).

Yan, et al., "Light Generation in Lead Halide Perovskite Nanocrystals: LEDs, Color Converters, Lasers, and Other Applications"; Nano Micro Small Journal, vol. 15, Issue47, Nov. 20, 2019, 1902079, First published: Oct. 25, 2019, https://doi.org/10.1002/smll.201902079. (Abstract).

Chen, et al., "Stable Multi-Wavelength Lasing in Single Perovskite Quantum Dot Superlattice"; Advanced Optical Materials, vol. 10, Issue17, Sep. 5, 2022, 2200494 First published: Jun. 5, 2022, https://doi.org/10.1002/adom.202200494. (Abstract).

Rajan, et al., "Space-resolved light emitting and lasing behaviors of crystalline perovskites upon femtosecond laser ablation"; Materials Today Physics, vol. 31, Feb. 2023, 101000. (Abstract).

Zhang, et al., "Advances in the Application of Perovskite Materials"; Nano-Micro Lett. 15, 177 (2023). https://doi.org/10.1007/s40820-023-01140-3, Review Open access, Published: Jul. 10, 2023, vol. 15, article No. 177, (2023).

Cegielski, et al., "Monolithically Integrated Perovskite Semiconductor Lasers on Silicon Photonic Chips by Scalable Top-Down Fabrication"; Nano Lett. 2018, 18, 11, 6915-6923 Publication Date: Oct. 2, 2018 https://doi.org/10.1021/acs.nanolett.8b02811.

Liu, et al., "Advances in inorganic and hybrid perovskites for miniaturized lasers"; Nanophotonics, vol. 9, No. 8, 2020, pp. 2251-2272. https://doi.org/10.1515/nanoph-2019-0572.

* cited by examiner

PEROVSKITE-BASED WHITE OR MULTI-WAVELENGTH LASER

CROSS-REFERENCE TO RELATED APPLICATION

This application is a divisional of U.S. patent application Ser. No. 19/350,268, filed on Oct. 6, 2025, the entire contents of which are incorporated herein by reference.

BACKGROUND

Field

The disclosure of the present patent application relates to a method for manufacturing an optoelectronic device using halide perovskite layers.

Description of Related Art

Recently, there has been a growing interest in developing lasers that can produce multiple colors or wavelengths beyond what is possible with a single laser material. In particular, there is growing interest in red, green, and blue (RGB) lasers that could be combined to create white lasers that can cover an entire visible spectrum. These types of lasers have many potential applications including biological/chemical sensing, data storage, communication, and lighting/display technologies. Despite the promising potential of RGB lasers and multi-wavelength lasers, there are still many technical challenges that need to be overcome before they can become commercially viable. These challenges include finding suitable laser materials that can produce multiple colors simultaneously, developing efficient methods for combining different wavelengths, and reducing the cost of production.

Perovskite materials have shown great potential in the field of light emission and lasers due to their excellent optical properties such as high photoluminescence quantum yield and tunable bandgap that covers the entire visible spectrum. Compositional engineering or dimensionality reduction can be used to control the bandgap, giving greater degrees of freedom in designing their optoelectronic properties. Additionally, perovskite lasers have exhibited low threshold energies and high emission efficiencies, making them promising candidates for various optoelectronic devices.

Thus, a method for manufacturing an optoelectronic device using halide perovskite layers for solving the aforementioned problems is desired.

SUMMARY

The present subject matter relates to a method for manufacturing an optoelectronic device using halide perovskite layers which, in one embodiment, includes providing a substrate; optionally depositing a first spacer layer on the substrate; depositing a first emission layer on the first spacer layer, if present, or on the substrate; depositing a second spacer layer on the first emission layer; depositing a second emission layer on the second spacer layer; optionally depositing a third spacer layer on the second emission layer; optionally depositing a third emission layer on the third spacer layer, if present; optionally depositing a fourth spacer layer on the third emission layer, if present; wherein the first emission layer, the second emission layer, and the third emission layer each comprise a halide perovskite layer; and wherein the halide perovskite layer of each of the first emission layer, the second emission layer, and the third emission layer comprises a three-dimensional halide perovskite, a two-dimensional halide perovskite, or a combination thereof.

In an embodiment, the steps of depositing the first spacer layer, the first emission layer, the second spacer layer, the second emission layer, the third spacer layer, the third emission layer, and the fourth spacer layer can each independently be conducted via a process of spin coating, dip coating, doctor blading, slot-die coating, inkjet printing, spray coating, screen printing, chemical vapor deposition, sputtering, pulsed laser deposition, or thermal evaporation.

In another embodiment, the process for each of the first spacer layer, the first emission layer, the second spacer layer, the second emission layer, the third spacer layer, the third emission layer, and the fourth spacer layer can be the thermal evaporation which can use or employ a thermal evaporation vacuum chamber system.

In an additional embodiment, the substrate can be loaded onto a substrate holder of the thermal evaporation vacuum chamber system.

In a supplementary embodiment, the steps of optionally depositing the first spacer layer on the substrate, optionally depositing the third spacer layer on the second emission layer, optionally depositing the third emission layer on the third spacer layer, and optionally depositing the fourth spacer layer on the third emission layer can include depositing the first spacer layer on the substrate, depositing the third spacer layer on the second emission layer, depositing the third emission layer on the third spacer layer, and depositing the fourth spacer layer on the third emission layer.

In a further embedment, the steps of optionally depositing the first spacer layer on the substrate, optionally depositing the third spacer layer on the second emission layer, optionally depositing the third emission layer on the third spacer layer, and optionally depositing the fourth spacer layer on the third emission layer can include omitting the depositing of the first spacer layer on the substrate, depositing the third spacer layer on the second emission layer, depositing the third emission layer on the third spacer layer, and depositing the fourth spacer layer on the third emission layer.

In an embodiment, the steps of optionally depositing the first spacer layer on the substrate, optionally depositing the third spacer layer on the second emission layer, optionally depositing the third emission layer on the third spacer layer, and optionally depositing the fourth spacer layer on the third emission layer can include omitting the depositing of the first spacer layer on the substrate, depositing the third spacer layer on the second emission layer, depositing the third emission layer on the third spacer layer, and omitting the depositing of the fourth spacer layer on the third emission layer.

In another embodiment, each of the first spacer layer, the second spacer layer, the third spacer layer, and the fourth spacer layer can include polymethyl methacrylate.

In an additional embodiment, each of the first spacer layer, the second spacer layer, the third spacer layer, and the fourth spacer layer can include a transparent polymer or a transparent metal having a refractive index that is less than, greater than, or equal to a refractive index of each of the first emission layer, the second emission layer, and the third emission layer, respectively.

In an embodiment, each of the first spacer layer, the second spacer layer and the third spacer layer can include a transparent polymer or a transparent metal having a refractive index that is greater than or equal to a refractive index of each of the first emission layer and the second emission layer, respectively.

In a supplementary embodiment, the halide perovskite layer of the first emission layer, the second emission layer, and the third emission layer can include $CsPbI_{1.5}Br_{1.5}$, $CsPbBr_3$, and $CsPbCl_3$, respectively.

In an embodiment, the method can further include the steps of: (a) sequentially and separately loading each of the polymethyl methacrylate of the first spacer layer, the $CsPbI_{1.5}Br_{1.5}$ of the first emission layer, the polymethyl methacrylate of the second spacer layer, the $CsPbBr_3$ of the second emission layer, the polymethyl methacrylate of the third spacer layer, the $CsPbCl_3$ of the third emission layer, and the polymethyl methacrylate of the fourth spacer layer into a tungsten boat of the thermal evaporation vacuum chamber system prior to the steps of depositing the respective layers; and (b) for each of the loaded polymethyl methacrylate of the first spacer layer, the $CsPbI_{1.5}Br_{1.5}$ of the first emission layer, the polymethyl methacrylate of the second spacer layer, the $CsPbBr_3$ of the second emission layer, the polymethyl methacrylate of the third spacer layer, the $CsPbCl_3$ of the third emission layer, and the polymethyl methacrylate of the fourth spacer layer, reducing a pressure within the thermal evaporation vacuum chamber system to about $10^{-4}$ mbar or less and increasing a current of the tungsten boat to about 17 amps or more to allow the respective layers within the tungsten boat to sequentially and separately evaporate toward the substrate thereby depositing: the evaporated polymethyl methacrylate of the first spacer layer on the substrate to obtain a polymethyl methacrylate first spacer layer film on the substrate, the evaporated $CsPbI_{1.5}Br_{1.5}$ of the first emission layer on the polymethyl methacrylate first spacer layer film to obtain a $CsPbI_{1.5}Br_{1.5}$ first emission layer film on the polymethyl methacrylate first spacer layer film, the evaporated polymethyl methacrylate of the second spacer layer on the $CsPbI_{1.5}Br_{1.5}$ first emission layer film to obtain a polymethyl methacrylate second spacer layer film on the $CsPbI_{1.5}Br_{1.5}$ first emission layer film, the evaporated $CsPbBr_3$ of the second emission layer on the polymethyl methacrylate second spacer layer film to obtain a $CsPbBr_3$ second emission layer film on the polymethyl methacrylate second spacer layer film, the evaporated polymethyl methacrylate of the third spacer layer on the $CsPbBr_3$ second emission layer film to obtain a polymethyl methacrylate third spacer layer film on the $CsPbBr_3$ second emission layer film, the evaporated $CsPbCl_3$ of the third emission layer on the polymethyl methacrylate third spacer layer film to obtain a $CsPbCl_3$ third emission layer film on the polymethyl methacrylate third spacer layer film, and the evaporated polymethyl methacrylate of the fourth spacer layer on the $CsPbCl_3$ third emission layer film to obtain a polymethyl methacrylate fourth spacer layer film on the $CsPbCl_3$ third emission layer film.

In another embodiment, the method can further include the steps of: (a) sequentially and separately loading each of the $CsPbI_{1.5}Br_{1.5}$ of the first emission layer, the transparent polymer or the transparent metal of the second spacer layer, the $CsPbBr_3$ of the second emission layer, the transparent polymer or the transparent metal of the third spacer layer, the $CsPbCl_3$ of the third emission layer, and the transparent polymer or the transparent metal of the fourth spacer layer into a tungsten boat of the thermal evaporation vacuum chamber system prior to the steps of depositing the respective layers; and (b) for each of the loaded $CsPbI_{1.5}Br_{1.5}$ of the first emission layer, the transparent polymer or the transparent metal of the second spacer layer, the $CsPbBr_3$ of the second emission layer, the transparent polymer or the transparent metal of the third spacer layer, the $CsPbCl_3$ of the third emission layer, and the transparent polymer or the transparent metal of the fourth spacer layer, reducing a pressure within the thermal evaporation vacuum chamber system to about $10^{-4}$ mbar or less and increasing a current of the tungsten boat to about 17 amps or more to allow the respective layers within the tungsten boat to sequentially and separately evaporate toward the substrate thereby depositing: the evaporated $CsPbI_{1.5}Br_{1.5}$ of the first emission layer on the substrate to obtain a $CsPbI_{1.5}Br_{1.5}$ first emission layer film on the substrate, the evaporated transparent polymer or the evaporated transparent metal of the second spacer layer on the $CsPbI_{1.5}Br_{1.5}$ first emission layer film to obtain a transparent polymer or a transparent metal second spacer layer film on the $CsPbI_{1.5}Br_{1.5}$ first emission layer film, the evaporated $CsPbBr_3$ of the second emission layer on the transparent polymer or the transparent metal second spacer layer film to obtain a $CsPbBr_3$ second emission layer film on the transparent polymer or the transparent metal second spacer layer film, the evaporated transparent polymer or the evaporated transparent metal of the third spacer layer on the $CsPbBr_3$ second emission layer film to obtain a transparent polymer or a transparent metal third spacer layer film on the $CsPbBr_3$ second emission layer film, the evaporated $CsPbCl_3$ of the third emission layer on the transparent polymer or the transparent metal third spacer layer film to obtain a $CsPbCl_3$ third emission layer film on the transparent polymer or the transparent metal third spacer layer film, and the evaporated transparent polymer or the evaporated transparent metal of the fourth spacer layer on the $CsPbCl_3$ third emission layer film to obtain a transparent polymer or a transparent metal fourth spacer layer film on the $CsPbCl_3$ third emission layer film.

In an additional embodiment, the method can further include the steps of: (a) sequentially and separately loading each of the $CsPbI_{1.5}Br_{1.5}$ of the first emission layer, the transparent polymer or the transparent metal of the second spacer layer, the $CsPbBr_3$ of the second emission layer, the transparent polymer or the transparent metal of the third spacer layer, and the $CsPbCl_3$ of the third emission layer into a tungsten boat of the thermal evaporation vacuum chamber system prior to the steps of depositing the respective layers; and (b) for each of the loaded $CsPbI_{1.5}Br_{1.5}$ of the first emission layer, the transparent polymer or the transparent metal of the second spacer layer, the $CsPbBr_3$ of the second emission layer, the transparent polymer or the transparent metal of the third spacer layer, and the $CsPbCl_3$ of the third emission layer, reducing a pressure within the thermal evaporation vacuum chamber system to about $10^{-4}$ mbar or less and increasing a current of the tungsten boat to about 17 amps or more to allow the respective layers within the tungsten boat to sequentially and separately evaporate toward the substrate thereby depositing: the evaporated $CsPbI_{1.5}Br_{1.5}$ of the first emission layer on the substrate to obtain a $CsPbI_{1.5}Br_{1.5}$ first emission layer film on the substrate, the evaporated transparent polymer or the evaporated transparent metal of the second spacer layer on the $CsPbI_{1.5}Br_{1.5}$ first emission layer film to obtain a transparent polymer or a transparent metal second spacer layer film on the $CsPbI_{1.5}Br_{1.5}$ first emission layer film, the evaporated $CsPbBr_3$ of the second emission layer on the transparent polymer or the transparent metal second spacer layer film to obtain a $CsPbBr_3$ second emission layer film on the transparent polymer or the transparent metal second spacer layer film, the evaporated transparent polymer or the evaporated transparent metal of the third spacer layer on the $CsPbBr_3$ second emission layer film to obtain a transparent polymer or a transparent metal third spacer layer film on the $CsPbBr_3$ second emission layer film, and the evaporated $CsPbCl_3$ of the third emission layer on the transparent polymer or the transparent metal third spacer layer film to obtain a $CsPbCl_3$ third emission layer film on the transparent polymer or the transparent metal third spacer layer film.

In a supplementary embodiment, prior to the step of loading the polymethyl methacrylate of the second spacer layer into the tungsten boat, the present methods can further comprise removing the substrate containing the $CsPbI_{1.5}Br_{1.5}$ first emission layer film on the polymethyl methacrylate first spacer layer film from the thermal evaporation vacuum chamber system; placing the substrate containing the $CsPbI_{1.5}Br_{1.5}$ first emission layer film on the polymethyl methacrylate first spacer layer film on a hotplate; and thermally annealing the $CsPbI_{1.5}Br_{1.5}$ first emission layer film at a temperate range of about 165° C. or more for about 10 minutes or more.

In a further embodiment, prior to the step of loading the polymethyl methacrylate of the second spacer layer into the tungsten boat, the present methods can further comprise removing the substrate containing the $CsPbI_{1.5}Br_{1.5}$ first emission layer film from the thermal evaporation vacuum chamber system; placing the substrate containing the $CsPbI_{1.5}Br_{1.5}$ first emission layer film on a hotplate; and thermally annealing the $CsPbI_{1.5}Br_{1.5}$ first emission layer film at a temperate range of about 165° C. or more for about 10 minutes or more.

In an embodiment, the three-dimensional halide perovskite can have a formula $ABX_3$: wherein A can be selected from the group consisting of methylammonium ($CH_3NH_3^+$), formamidinium ($CH(NH_2)_2^+$), cesium ($Cs^+$), rubidium ($Rb^+$), potassium ($K^+$), and a combination thereof; wherein B can be selected from the group consisting of lead ($Pb^{2+}$), tin ($Sn^{2+}$), germanium ($Ge^{2+}$), bismuth ($Bi^{3+}$), antimony ($Sb^{3+}$), and a combination thereof; and wherein X can be selected from the group consisting of iodide ($I^-$), bromide ($Br^-$), chloride ($Cl^-$), fluoride ($F^-$), and a combination thereof; and wherein the two-dimensional halide perovskite can have one or both of formulas $R_2A_{n-1}B_nX_{3n+1}$, and $DA_{n-1}B_nX_{3n+1}$: wherein R can be selected from the group consisting of butylammonium (BA), butylammonium ($C_4H_9NH_3^+$), phenethylamine (PEA), phenethylammonium ($C_6H_5C_2H_4NH_3^+$), octylammonium (OA), $C_8H_{17}NH_3^+$, hexylammonium (HA), $C_6H_{13}NH_3^+$, benzylammonium (BZA), aminobenzyl ($C_6H_5CH_2NH_3^+$), cyclohexylammonium ($C_6H_{13}N$), $C_6H_{11}NH_3^+$, and a combination thereof; wherein D can be selected from the group consisting of 1,4-butanediammonium ($C_4H_{14}N_2^{+2}$), $NH_3(CH_2)_4NH_3$, 1,3-propanediammonium (PDA), $NH_3(CH_2)_3NH_3$, ethylenediammonium ($C_2H_8N_2$), $NH_3(CH_2)_2NH_3$, 1,6-hexanediamine (HDA), $NH_3(CH_2)_6NH_3$, and a combination thereof; wherein A can be selected from the group consisting of methylammonium ($CH_3NH_3^+$), formamidinium ($CH(NH_2)_2^+$), cesium ($Cs^+$), rubidium ($Rb^+$), potassium ($K^+$), and a combination thereof; wherein B can be selected from the group consisting of lead ($Pb^{2+}$), tin ($Sn^{2+}$), germanium ($Ge^{2+}$), bismuth ($Bi^{3+}$), antimony ($Sb^{3+}$), and a combination thereof; and wherein X can be selected from the group consisting of iodide ($I^-$), bromide ($Br^-$), chloride ($Cl^-$), fluoride ($F^-$), and a combination thereof.

These and other features of the present subject matter will become readily apparent upon further review of the following specification.

BRIEF DESCRIPTION OF DRAWINGS

Similar reference characters denote corresponding features consistently throughout the attached drawings.

DETAILED DESCRIPTION

Figure 1:
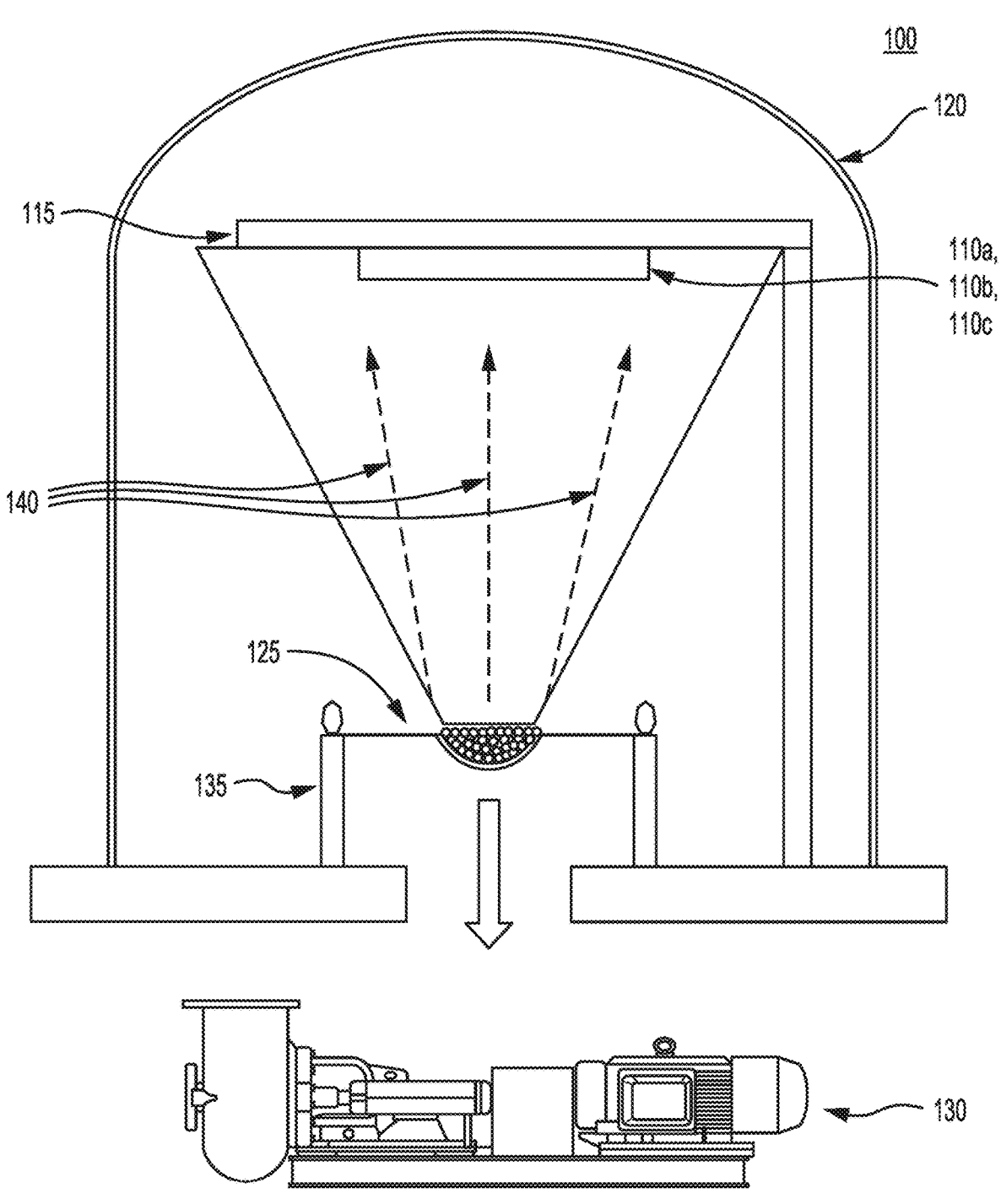
FIG. 1 depicts a thermal evaporation vacuum chamber system.

The following definitions are provided for the purpose of understanding the present subject matter and for construing the appended patent claims. The definitions are not meant to be limiting to the subject matter described herein.

Definitions

Throughout the application, where systems are described as having, including, or comprising specific components, or where processes are described as having, including, or comprising specific process steps, it is contemplated that compositions of the present teachings can also consist essentially of, or consist of, the recited components, and that the processes of the present teachings can also consist essentially of, or consist of, the recited process steps.

It is noted that, as used in this specification and the appended claims, the singular forms "a", "an", and "the" include plural references unless the context clearly dictates otherwise.

In the application, where an element or component is said to be included in and/or selected from a list of recited elements or components, it should be understood that the element or component can be any one of the recited elements or components, or the element or component can be selected from a group consisting of two or more of the recited elements or components. Further, it should be understood that elements and/or features of a system or a method described herein can be combined in a variety of ways without departing from the spirit and scope of the present teachings, whether explicit or implicit herein.

The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

The term "optional" or "optionally" means that the subsequently described event or circumstance may or may not occur, and that the description includes instances where said event or circumstance occurs and instances in which it does not.

Unless defined otherwise, all technical and scientific terms used herein have the same meaning as commonly understood to one of ordinary skill in the art to which the presently described subject matter pertains.

Where a range of values is provided, for example, concentration ranges, percentage ranges, or ratio ranges, it is understood that each intervening value, to the tenth of the unit of the lower limit, unless the context clearly dictates otherwise, between the upper and lower limit of that range and any other stated or intervening value in that stated range, is encompassed within the described subject matter. The upper and lower limits of these smaller ranges may independently be included in the smaller ranges, and such embodiments are also encompassed within the described subject matter, subject to any specifically excluded limit in the stated range. Where the stated range includes one or both of the limits, ranges excluding either or both of those included limits are also included in the described subject matter.

Throughout the application, descriptions of various embodiments use "comprising" language. However, it will be understood by one of skill in the art, that in some specific instances, an embodiment can alternatively be described using the language "consisting essentially of" or "consisting of".

For purposes of better understanding the present teachings and in no way limiting the scope of the teachings, unless otherwise indicated, all numbers expressing quantities, percentages or proportions, and other numerical values used in the specification and claims, are to be understood as being modified in all instances by the term "about". Accordingly, unless indicated to the contrary, the numerical parameters set forth in the following specification and attached claims are approximations that may vary depending upon the desired properties sought to be obtained. At the very least, each numerical parameter should at least be construed in light of the number of reported significant digits and by applying ordinary rounding techniques.

The present subject matter relates to a method for manufacturing an optoelectronic device using halide perovskite layers which, in one embodiment, includes providing a substrate; optionally depositing a first spacer layer on the substrate; depositing a first emission layer on the first spacer layer, if present, or on the substrate; depositing a second spacer layer on the first emission layer; depositing a second emission layer on the second spacer layer; optionally depositing a third spacer layer on the second emission layer; optionally depositing a third emission layer on the third spacer layer, if present; optionally depositing a fourth spacer layer on the third emission layer, if present; wherein the first emission layer, the second emission layer, and the third emission layer each comprise a halide perovskite layer; and wherein the halide perovskite layer of each of the first emission layer, the second emission layer, and the third emission layer comprises a three-dimensional halide perovskite, a two-dimensional halide perovskite, or a combination thereof.

In one embodiment, the method can include the steps of depositing the first spacer layer, the first emission layer, the second spacer layer, the second emission layer, the third spacer layer, the third emission layer, and the fourth spacer layer can each independently be conducted via a process of spin coating, dip coating, doctor blading, slot-die coating, inkjet printing, spray coating, screen printing, chemical vapor deposition, sputtering, pulsed laser deposition, or thermal evaporation. In a non-limiting embodiment, the process for each of the first spacer layer, the first emission layer, the second spacer layer, the second emission layer, the third spacer layer, the third emission layer, and the fourth spacer layer can be the thermal evaporation, which use or employ a thermal evaporation vacuum chamber system (100) as depicted in FIG. 1.

Symmetrical Waveguide RGB White Laser

Figure 2:
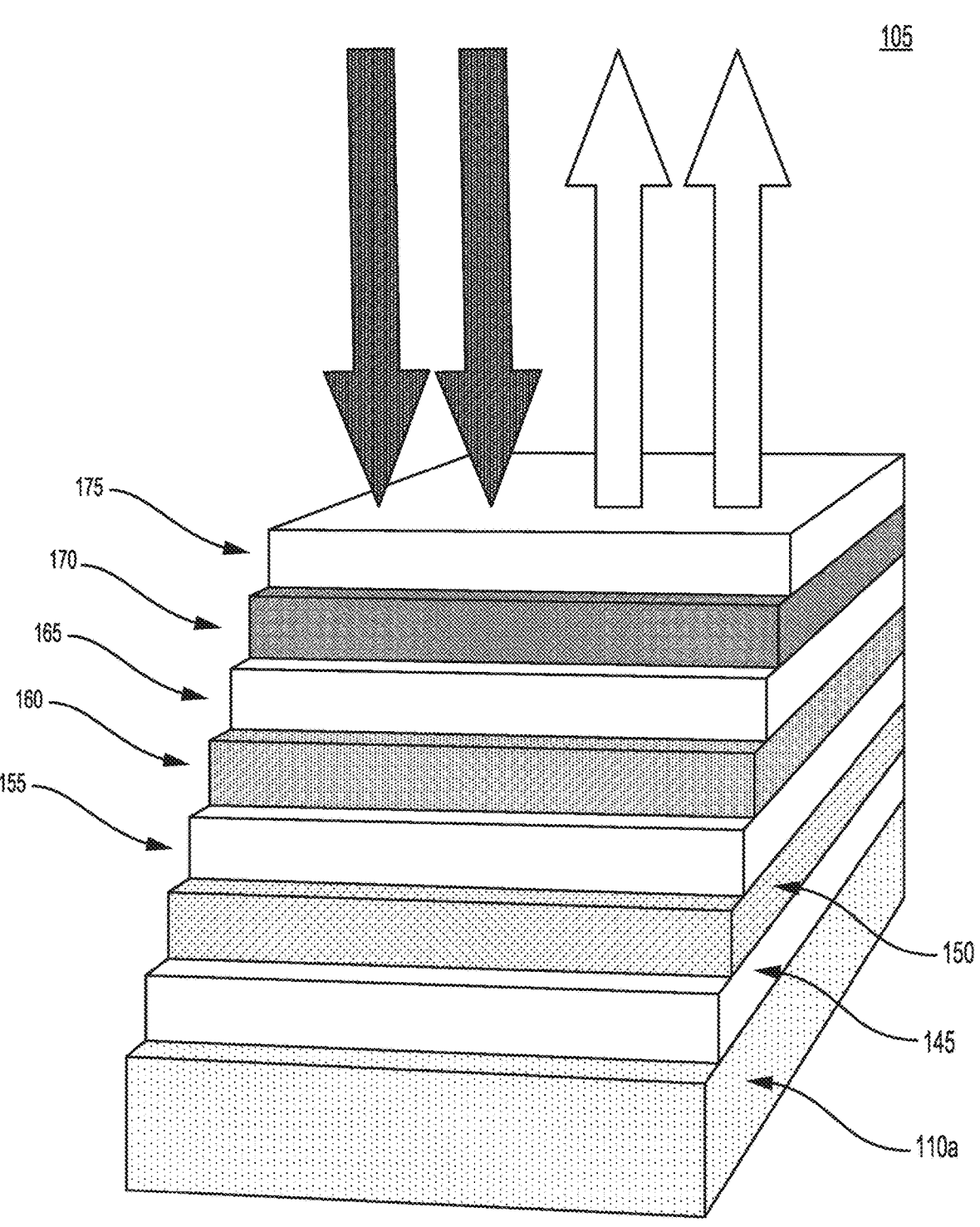
FIG. 2 depicts a symmetrical waveguide RGB white laser for an optoelectronic device.

In an embodiment, the method and the thermal evaporation vacuum chamber system (100) of FIG. 1 can be used to manufacture a symmetrical waveguide RGB white laser (105), as shown in FIG. 2, for an optoelectronic device. In this regard, the method can begin with step 1 of obtaining a substrate (110a), which can be cleaned via a cleaning method. In an embodiment of a suitable, non-limiting, cleaning method in this regard, the substrates can be sonicated by an ultrasonicator in soapy water for about 15 min, followed by sonication in water alone for about 15 min. The substrates can then be sequentially ultrasonicated in acetone and isopropyl alcohol (IPA) for about 15 min each and allowed to dry. Then the substrates can be subjected to UV-Ozone irradiation.

In certain non-limiting embodiments, the substrate can be made of glass, sapphire, quartz, mica, silicon, plastics (e.g., polyethylene terephthalate (PET), polyethylene naphthalate (PEN), polyimide (PI), polycarbonate (PC), polyethersulfone (PES)), metal foils (e.g., stainless steel, copper, titanium, nickel, tungsten, molybdenum, silver), ceramics (e.g., alumina, silicon nitride), and a combination thereof. The cleaned substrate (110a) can be loaded onto a substrate holder (115) within a vacuum chamber (120) of the thermal evaporation vacuum chamber system (100) as shown in FIG. 1. In another non-limiting embodiment, the vacuum chamber (120) can be a glass bell jar.

In an embodiment of step 2, after the cleaned substrate (110a) was loaded, polymethyl methacrylate (PMMA) of the first spacer layer can be loaded into a tungsten boat (125) within the vacuum chamber (120) of the thermal evaporation vacuum chamber system (100) as shown in FIG. 1. In an embodiment, the PMMA can have a refractive index (n) of 1.48 measured at a wavelength of about 589 nm or about 632 nm. In this regard, in an embodiment, the PMMA first spacer layer film (145), PMMA second spacer layer film (155), PMMA third spacer layer film (165), and PMMA fourth spacer layer film (175), as described herein, can all have the same refractive index.

In an embodiment of step 3, pressure within the vacuum chamber (120) of the thermal evaporation vacuum chamber system (100) can be reduced to about $10^{-4}$ mbar or less via a pumping system (130), while a current of the tungsten boat (125) can be increased to about 17 amps or more via a high current source (135) as shown in FIG. 1. Due to the reduced pressure and the heating of the PMMA of the first spacer layer via the current adjustment, the PMMA within the tungsten boat (125) can be evaporated, as evaporation plume (140), towards the substrate (110a) to deposit a first spacer layer of the PMMA on the substrate (110*a*) thereby forming a PMMA first spacer layer film (145) on the substrate (110*a*) as shown in FIG. 2. In an embodiment, the PMMA first spacer layer film (145) can have a thickness of 5 nm, about 5 nm, or more. In a further non-limiting embodiment, the thickness of the PMMA first spacer layer film (145) can be about 30 nm or 30 nm.

Unexpectedly, it was discovered that when the pressure of the vacuum chamber (120) was reduced to $10^{-4}$ mbar and the current of the tungsten boat (125) was increased to a range of 17 amps to 20 amps, evaporation rate and deposition rate (rate of depositing on the substrate (110*a*)) were maximized for the PMMA of the first spacer layer due to minimal collision between the evaporated PMMA and ambient gas molecules (i.e., residual gas particles) within the vacuum chamber (120). This unexpected result also applied to all the spacer and emission layers (i.e., PMMA of a second spacer layer, PMMA of a third spacer layer, PMMA of a fourth spacer layer, $CsPbI_{1.5}Br_{1.5}$ of a first emission layer, $CsPbBr_3$ of a second emission layer, $CsPbCl_3$ of a third emission layer, transparent polymer or transparent metal of a first spacer layer, transparent polymer or transparent metal of a second spacer layer, transparent polymer or transparent metal of a third spacer layer, and transparent polymer or transparent metal of a fourth spacer layer as described herein).

In an embodiment of step 4, after the formation of the PMMA first spacer layer film (145), perovskite materials, which may include lead iodide ($PbI_2$), cesium iodide (CsI), lead bromide ($PbBr_2$), and cesium bromide (CsBr), can be separately premixed in equal molar ratios. Then the premixed perovskite materials can be combined to form $CsPbI_{1.5}Br_{1.5}$ of a first emission layer, which is a halide perovskite. In an embodiment, the equal molar ratios are designed to keep the perovskite ABX3 formal, with the specific quantities employed being dependent on the required layer thickness.

In an embodiment of step 5, step 2 can be repeated for the $CsPbI_{1.5}Br_{1.5}$ of the first emission layer (PMMA was excluded from this step).

In an embodiment of step 6, the same pressure reduction and the current adjustment of step 3 can be repeated for the $CsPbI_{1.5}Br_{1.5}$ of the first emission layer, resulting in the $CsPbI_{1.5}Br_{1.5}$ within the tungsten boat (125) being evaporated, as evaporation plume (140), towards the substrate (110*a*) to deposit a first emission layer of the $CsPbI_{1.5}Br_{1.5}$ on the substrate (110*a*) thereby forming a $CsPbI_{1.5}Br_{1.5}$ first emission layer film (150) on the PMMA first spacer layer film (145) as shown in FIG. 2. The $CsPbI_{1.5}Br_{1.5}$ first emission layer film (150) can have a thickness of about 350 nm, or 350 nm. The color of the $CsPbI_{1.5}Br_{1.5}$ first emission layer film (150) can be red. In an embodiment, the $CsPbI_{1.5}Br_{1.5}$ first emission layer film (150) can have a refractive index that is greater than the refractive index of the PMMA first spacer layer film (145). In another embodiment, the $CsPbI_{1.5}Br_{1.5}$ first emission layer film (150) can have a refractive index of about 2.1 or 2.1.

In an embodiment of step 7, the substrate (110*a*), containing the $CsPbI_{1.5}Br_{1.5}$ first emission layer film (150) on the PMMA first spacer layer film (145), can be removed from the vacuum chamber (120) of the thermal evaporation vacuum chamber system (100). Afterward, the substrate (110*a*) can be placed on a hotplate (not shown) to thermally anneal the $CsPbI_{1.5}Br_{1.5}$ first emission layer film (150) at a temperate range of about 165° C. or more for about 10 minutes or more. In certain non-limiting embodiments, the $CsPbI_{1.5}Br_{1.5}$ first emission layer film (150) can be annealed at a temperature of 165° C. for 10 minutes.

Unexpectedly, it was found that annealing at a temperate of 165° C. for 10 minutes provided the best conditions for promoting optimal crystal growth within the $CsPbI_{1.5}Br_{1.5}$ structure (i.e., at 165° C. for 10 minutes, there is sufficient thermal energy necessary to drive chemical reactions between the $PbI_2$, —CsI and the $PbBr_2$—CsBr precursors), enhancing quality of the $CsPbI_{1.5}Br_{1.5}$ first emission layer film (150), and removing any defects within the $CsPbI_{1.5}Br_{1.5}$ first emission layer film (150). This unexpected result also applies to step 22 as described herein. After the annealing process, the substrate (110*a*) can be reloaded onto the substrate holder (115) as shown in FIG. 1. The color of the $CsPbI_{1.5}Br_{1.5}$ first emission layer film (150) can be red. In certain embodiments, the annealing temperatures should not exceed a limit dependent on the boiling points of the materials that make up the different layers.

In an embodiment of step 8, after the formation of the $CsPbI_{1.5}Br_{1.5}$ first emission layer film (150), step 2 can be repeated for a PMMA of a second spacer layer.

In an embodiment of step 9, the same pressure reduction and the current adjustment of step 3 can be repeated for the PMMA of the second spacer layer, resulting in the PMMA within the tungsten boat (125) being evaporated, as evaporation plume (140), towards the substrate (110*a*) to deposit the second spacer layer of the PMMA on the substrate (110*a*) thereby forming a PMMA second spacer layer film (155) on the $CsPbI_{1.5}Br_{1.5}$ first emission layer film (150) as shown in FIG. 2. The PMMA second spacer layer film (155) can have a thickness of about 5 nm or more. In a particular non-limiting embodiment, the PMMA second spacer layer film (155) can have a thickness of 30 nm.

Unexpectedly, it was found that when the thickness of the PMMA second spacer layer film (155) was at 30 nm, halide chemical compounds from adjacent emission layer films (i.e., $CsPbI_{1.5}Br_{1.5}$ first emission layer film (150) and $CsPbBr_3$ second emission layer film (160) as described herein) can be prevented from mixing with each other.

In an embodiment of step 10, after the formation of the PMMA second spacer layer film (155), step 2 can be repeated for $CsPbBr_3$ of a second emission layer, which is a halide perovskite (PMMA was excluded from this step).

In an embodiment of step 11, the same pressure reduction and the current adjustment of step 3 can be repeated for the $CsPbBr_3$ of the second emission layer, resulting in the $CsPbBr_3$ within the tungsten boat (125) being evaporated, as evaporation plume (140), towards the substrate (110*a*) to deposit the second emission layer of the $CsPbBr_3$ on the substrate (110*a*) thereby forming a $CsPbBr_3$ second emission layer film (160) on the PMMA second spacer layer film (155) as shown in FIG. 2. The $CsPbBr_3$ second emission layer film (160) can have a thickness of about 350 nm. The color of the $CsPbBr_3$ second emission layer film (160) can be green. In an embodiment, the $CsPbBr_3$ second emission layer film (160) can have a refractive index that is greater than the refractive index of the PMMA second spacer layer film (155). In another embodiment, the $CsPbBr_3$ second emission layer film (160) can have a refractive index (n) of about 2.029 or 2.029.

In an embodiment of step 12, after the formation of $CsPbBr_3$ second emission layer film (160), step 2 can be repeated for a PMMA of a third spacer layer.

In an embodiment of step 13, the same pressure reduction and the current adjustment of step 3 can be repeated for the PMMA of the third spacer layer, resulting in the PMMA within the tungsten boat (125) being evaporated, as evaporation plume (140), towards the substrate (110a) to deposit the third spacer layer of the PMMA on the substrate (110a) thereby forming a PMMA third spacer layer film (165) on the CsPbBr$_3$ second emission layer film (160) as shown in FIG. 2. The PMMA third spacer layer film (165) can have a thickness of about 5 nm, 5 nm, or more. In some non-limiting embodiments, the PMMA third spacer layer film (165) can have a thickness of 30 nm or about 30 nm.

Unexpectedly, it was found that when the thickness of the PMMA third spacer layer film (165) was at 30 nm, halide chemical compounds from adjacent emission layer films (i.e., CsPbBr$_3$ second emission layer film (160) and CsPbCl$_3$ third emission layer film (170) as described herein) were prevented from mixing with each other.

In an embodiment of step 14, after the formation of the PMMA third spacer layer film (165), step 2 can be repeated for CsPbCl$_3$ of a third emission layer, which is a halide perovskite (PMMA was excluded from this step).

In an embodiment of step 15, the same pressure reduction and the current adjustment of step 3 can be repeated for the CsPbCl$_3$ of the third emission layer, resulting in the CsPbCl$_3$ within the tungsten boat (125) being evaporated, as evaporation plume (140), towards the substrate (140) to deposit the third emission layer of the CsPbCl$_3$ on the substrate (140) thereby forming a CsPbCl$_3$ third emission layer film (170) on the PMMA third spacer layer film (165) as shown in FIG. 2. The CsPbCl$_3$ third emission layer film (170) can have a thickness of about 350 nm or 350 nm. The color of the CsPbCl$_3$ third emission layer film (170) can be blue. In an embodiment, the CsPbCl$_3$ third emission layer film (170) can have a refractive index that is greater than the refractive index of the PMMA third spacer layer film (165). In another embodiment, the CsPbCl$_3$ third emission layer film (170) can have a refractive index (n) of about 1.893 or 1.893.

In an embodiment of step 16, after the formation of the CsPbCl$_3$ third emission layer film (170), step 2 can be repeated for a PMMA of a fourth spacer layer.

In an embodiment of step 17, the same pressure reduction and the current adjustment of step 3 can be repeated for the PMMA of the fourth spacer layer, resulting in the PMMA within the tungsten boat (125) being evaporated, as evaporation plume (140), towards the substrate (110a) to deposit the fourth spacer layer of the PMMA on the substrate (110a) thereby forming a PMMA fourth spacer layer film (175) on the CsPbCl$_3$ third emission layer film (170) as shown in FIG. 2. The PMMA fourth spacer layer film (175) can have a thickness of about 5 nm, or 5 nm, or more. As a non-limiting embodiment, the thickness of the PMMA fourth spacer layer film (175) can be 30 nm. After forming the PMMA fourth spacer layer film (175), the substrate (110a) can be removed from the vacuum chamber (120) of the thermal evaporation vacuum chamber system (100).

All of the spacer layer films (145,155,165,175) as shown in FIG. 2 provide several benefits. Firstly, the spacer layer films (145,155,165,175) can serve as passivation and encapsulation layers for the emission layer films (150, 160,170). Secondly, the spacer layer films (155,165) can prevent diffusion among different adjacent emission layer films (150,160,170). As a non-limiting example, if the PMMA third spacer layer film (165) was omitted, then the CsPbCl$_3$ third emission layer film (170) can diffuse into the CsPbBr$_3$ second emission layer film (160), thereby resulting in formation of the CsPbCl$_{1.5}$Br$_{1.5}$. Thirdly, in instances where the spacer layer films (145,155,165,175) are all made from PMMA, symmetric wave guides can be created along all the emission layer films (150,160,170).

In an embodiment, the photon excitation light (320) can pass through the spacer layer films (145,155,165,175) and the emission layer films (150,160,170) while also being uniformly absorbed by the emission layer films (150,160, 170). The absorbance of the photon excitation light (320) can cause excitation (i.e., electrons within the emission layer films (150, 160,170) jumping to excited states) of the emission layer films (150,160,170). After the absorbing and excitation steps, each one of the emission layer films (150, 160,170) can emit photons (i.e., the excited electrons return to lower energy states and emit photons) in the form of light (i.e., face emission light (325) and edge emission light (330)) (hereinafter, the face emission light (325) and the edge emission light (330) emitted by the emission layer films (150,160,170) will be referred as "emission lights (325/330)") in all directions at its emission wavelength.

In a non-limiting embodiment, the photon excitation light (320) can be perpendicular to the PMMA fourth spacer layer film (175) so that it can pass through the spacer layer films (145,155,165,175) and the emission layer films (150,160, 170) while exciting all the emission layer films (150,160, 170). In another non-limiting embodiment, the photon excitation light (320) can be tilted at angle with respect to the to the PMMA fourth spacer layer film (175) so that it can pass through the spacer layer film(s) (175 or 175 and 165) and the emission layer film(s) (170 or 170 and 160, respectively) to selectively excite just the CsPbCl$_3$ third emission layer film (170) or both the CsPbCl$_3$ third emission layer film (170) and the CsPbBr$_3$ second emission layer film (160), respectively. In an embodiment, the tilting angle can be adjusted based on Snell's law as described herein.

Due to the nature of the symmetric waveguides and because the refractive indexes of all the spacer layer films (145,155,165,175) (i.e., n (PMMA)=1.48) are lower than the refractive indexes of all the emission layer films (150,160, 170) (i.e., n (CsPbI$_{1.5}$Br$_{1.5}$)=about 2.1 or 2.1, n (CsPbBr$_3$) =about 2.029 or 2.029, and n (CsPbCl$_3$)=about 1.893 or 1.893), the incidence angles of the emission lights (325/330) with respect to the spacer layers (145,155,165,175) above and below each one of the emission layer films (150,160, 170) can cause certain characteristics on the emission lights (325/330). When the emission lights (325/330) pass through the spacer layer films (145,155,165,175) and the emission layer films (150, 160,170) having different refractive indexes as mentioned above, the emission lights (325/330) can follow Snell's law:

$$n1\sin(\theta1) = n2\sin(\theta2)$$

where n1 is the refractive index of material 1 (from which the light ray travels), n2 is the refractive index of material 2 (into which the light ray travels), θ1 is the angle of incidence which is the angle between a line normal (perpendicular) to the boundary between two materials and the incoming light ray, and θ2 is the angle of refraction which is the angle between the normal to the boundary and is also the angle the light ray is traveling through material 2.

In this regard, when the incidence angles of the emission lights (325/330) are zero with respect to the spacer layer films (145, 155,165, 175) above and below each one of the emission layer films (150,160,170), the emission lights (325/330) can pass through the spacer layer films (145,155, 165,175) and the emission layer films (150,160,170) without changing its direction and regardless of the refractive indexes of all the mentioned films thereby resulting in the face emission light (325) as shown in FIG. 2. Corresponding to this embodiment, the edge emission light (330) emitted by the emission layer films (150,160,170) can be weakened while being directed along the path of the face emission light (325).

Conversely, when the incidence angles of the emission lights (325/330) are greater than zero with respect to the spacer layer films (145,155,165,175) above and below each one of the emission layer films (150, 160, 170), the emission lights (325/330) can have three different routes depending on the difference of refraction indexes of the spacer layer films (145,155, 165,175) and the emission layer films (150, 160,170) and the incidence angles of the emission lights (325/330).

According to a first route in a non-limiting embodiment, the emission lights (325/330) can pass through the spacer layer films (145,155, 165, 175) and the emission layer films (150,160,170) with changed angle. According to an alternative second route in another non-limiting embodiment, the emission lights (325/330) can propagate along the interfaces (i.e., critical angle) of the spacer layer films (145, 155,165, 175) and the emission layer films (150,160,170) toward the edges of the emission layer films (150,160,170) thereby resulting in an edge emission light (330) as shown in FIG. 2. Corresponding to this embodiment, the face emission light (325) emitted by the emission layer films (150,160, 170) can be weakened while being directed along the path of the edge emission light (330). According to another alternative third route in a further non-limiting embodiment, the emission lights (325/330) can be reflected within the spacer layer films (145,155,165,175) and the emission layer films (150,160,170) (i.e., total internal inflection) and propagate along the latter toward the edges of the emission layer films (150,160,170) thereby resulting in the edge emission light (330). Corresponding to this embodiment, the face emission light (325) emitted by the emission layer films (150,160, 170) can be weakened while being directed along the path of the edge emission light (330). Since the refractive indexes of all the spacer layer films (145,155,165,175) are lower than the refractive indexes of all the emission layer films (150, 160, 170) as mentioned above, a strong waveguiding effect can be achieved thereby resulting in the edge emission light (330).

Asymmetrical Waveguide Structure

Figure 3:
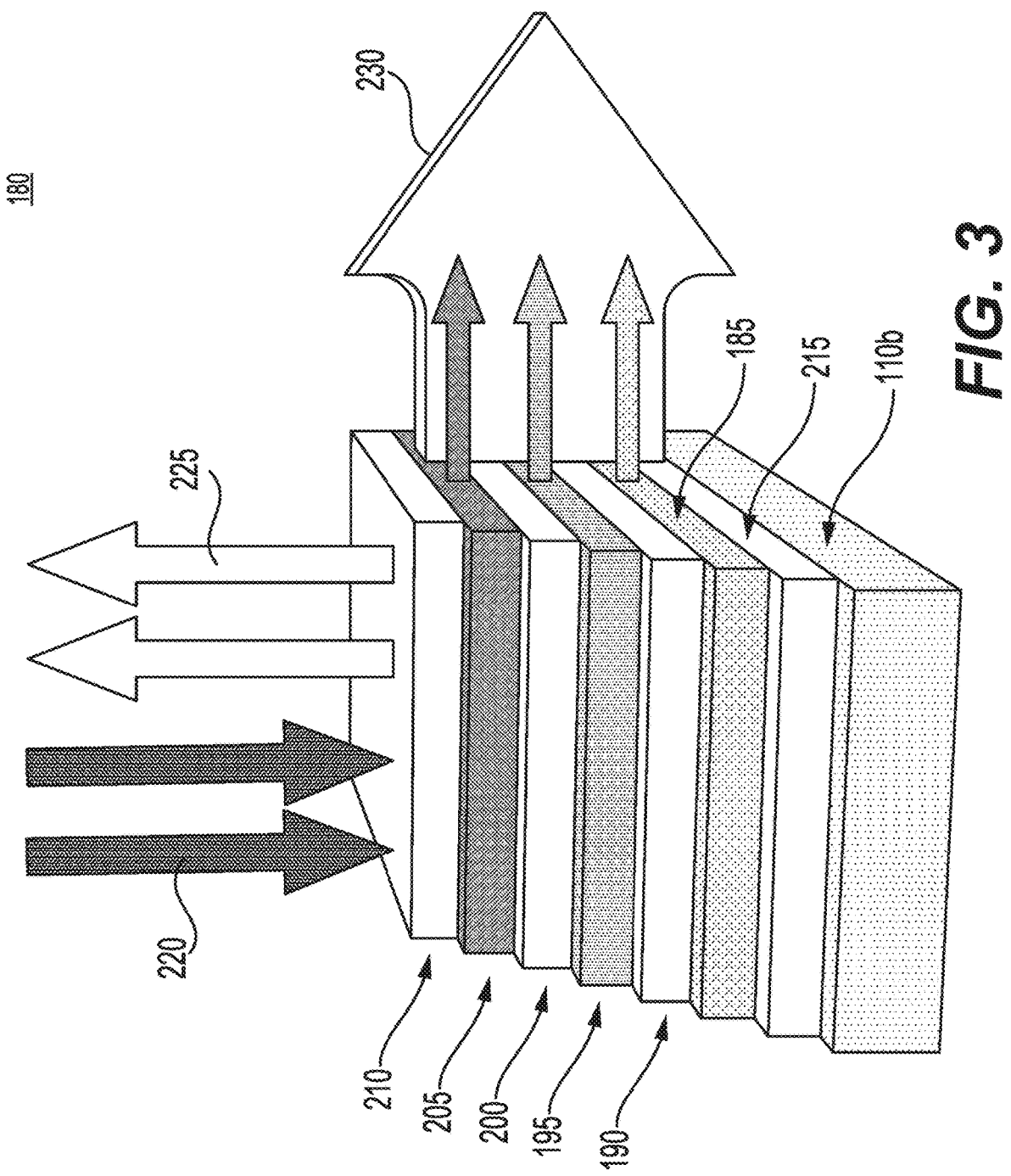
FIG. 3 depicts an asymmetrical waveguide structure for an optoelectronic device.

In embodiment, the method and the thermal evaporation vacuum chamber system (100) can also be used to manufacture an asymmetrical waveguide structure (180), as shown in FIG. 3, for an optoelectronic device. In this regard, the method can begin with step 18 of obtaining a new substrate (110b) and repeating step 1. The new substrate (110b) can be made of the same material as the substrate (110a) in step 1 or of a different material as listed in step 1.

In an embodiment of step 19, after the substrate (110b) was loaded, step 4 can be repeated for the formation of $CsPbI_{1.5}Br_{1.5}$ of the first emission layer (excluding a formation of a PMMA first spacer layer film).

In an embodiment of step 20, step 5 can be repeated for the $CsPbI_{1.5}Br_{1.5}$ of the first emission layer.

In an embodiment of step 21, step 6 can be repeated for the $CsPbI_{1.5}Br_{1.5}$ of the first emission layer, thereby forming the $CsPbI_{1.5}Br_{1.5}$ first emission layer film (185) on the substrate (110b). The $CsPbI_{1.5}Br_{1.5}$ first emission layer film (185) can have a thickness of about 350 nm or 350 nm. The color of the $CsPbI_{1.5}Br_{1.5}$ first emission layer film (185) can be red.

In an embodiment of step 22, step 7 can be repeated for the substrate (110b) containing only the $CsPbI_{1.5}Br_{1.5}$ first emission layer film (185), thereby generating the same unexpected result as indicated in Step 7.

In an embodiment of step 23, step 8 can be repeated for a transparent polymer or a transparent metal of a second spacer layer. The transparent polymer or the transparent metal of the second spacer layer can have a refractive index that is less than, greater than, or equal to a refractive index of the $CsPbI_{1.5}Br_{1.5}$ first emission layer film (185). The $CsPbI_{1.5}Br_{1.5}$ first emission layer film (185) can have a refractive index (n) of about 2.1. The transparent polymer can be selected from the group consisting of polymethyl methacrylate (PMMA), polystyrene (PS), polycarbonate (PC), polyvinylidene fluoride (PVDF), epoxy resin, polyethylene oxide (PEO), and a combination thereof. The refractive indexes (n) of the PMMA, PS, PC, PVDF, epoxy resin, and the PEO can be 1.48, 1.59, 1.58-1.59, 1.42-1.47, 1.50-1.60, and 1.45-1.50, respectively. In certain embodiments, these refractive indices can be measured at a wavelength of about 589 nm or at about 632 nm. The transparent metal can be selected from the group consisting of titanium dioxide ($TiO_2$), indium tin oxide (ITO), aluminum-doped zinc oxide (AZO), zirconium dioxide ($ZrO_2$), silicon dioxide (SiO2), silicon monoxide (SiO), aluminum oxide ($Al_2O_3$), tin oxide ($SnO_2$), indium oxide ($In_2O_3$), tantalum pentoxide ($Ta_2O_5$), zinc sulfide (ZnS), zinc oxide (ZnO), magnesium oxide (MgO), and a combination thereof. The refractive indexes (n) of the $TiO_2$, ITO, AZO, $ZrO_2$, SiO2, SiO, $Al_2O_3$, $SnO_2$, $In_2O_3$, $Ta_2O_5$, ZnS, ZnO, MgO can be 2.4, 1.8270, 1.8284, 2.1588, 1.4585, 1.7100, 1.77, 1.5-2.6, 1.8-2.0, 2.1, 2.356, 2.008, 1.736, respectively. In certain embodiments, these refractive indices can be measured at a wavelength of about 589 nm or at about 632 nm.

In an embodiment of step 24, step 9 can be repeated for the transparent polymer or the transparent metal of the second spacer layer, thereby forming a transparent polymer or a transparent metal second spacer layer film (190) on the $CsPbI_{1.5}Br_{1.5}$ first emission layer film (185) as shown in FIG. 3. The transparent polymer or the transparent metal second spacer layer film (190) can have a thickness of about 5 nm, 5 nm, or more. As a non-limiting embodiment, the transparent polymer or the transparent metal second spacer layer film (190) can have a thickness of 30 nm.

Unexpectedly, it was found that when the thickness of the transparent polymer or the transparent metal second spacer layer film (190) was at 30 nm, halide chemical compounds from adjacent emission layer films (i.e., $CsPbI_{1.5}Br_{1.5}$ first emission layer film (185) and $CsPbBr_3$ second emission layer film (195) as described herein) were prevented from mixing with each other.

In an embodiment of step 25, step 10 can be repeated for the $CsPbBr_3$ of the second emission layer.

In an embodiment of step 26, step 11 can be repeated for the $CsPbBr_3$ of the second emission layer, thereby forming the $CsPbBr_3$ second emission layer film (195) on the transparent polymer or the transparent metal second spacer layer film (190) as shown in FIG. 3. The $CsPbBr_3$ second emission layer film (195) can have a thickness of about 350 nm or 350 nm. The color of the $CsPbBr_3$ second emission layer film (195) can be green.

In an embodiment of step 27, step 12 can be repeated for a transparent polymer or a transparent metal of a third spacer layer. The transparent polymer or the transparent metal of the third spacer layer can have a refractive index that is less than, greater than, or equal to a refractive index of the $CsPbBr_3$ second emission layer film (195). The $CsPbBr_3$ second emission layer film (195) can have a refractive index (n) of about 2.029 or 2.029. Any of the transparent polymer or the transparent metal, as indicated in Step 23, can be used for the third spacer layer.

In an embodiment of step 28, step 13 can be repeated for the transparent polymer or the transparent metal of the third spacer layer, thereby forming a transparent polymer or a transparent metal third spacer layer film (200) on the CsPbBr$_3$ second emission layer film (195) as shown in FIG. 3. The transparent polymer or the transparent metal third spacer layer film (200) can have a thickness of about 5 nm, 5 nm, or more. In a non-limiting embodiment, the PMMA third spacer layer film (165) can have a thickness of 30 nm.

Unexpectedly, it was found that when the thickness of the transparent polymer or the transparent metal third spacer layer film (200) was at 30 nm, halide chemical compounds from adjacent emission layer films (i.e., CsPbBr$_3$ second emission layer film (195) and CsPbCl$_3$ third emission layer film (205) as described herein) were prevented from mixing with each other.

In an embodiment of step 29, step 14 can be repeated for the CsPbCl$_3$ of the third emission layer.

In an embodiment of step 30, step 15 can be repeated for the CsPbCl$_3$ of the third emission layer, thereby forming the CsPbCl$_3$ third emission layer film (205) on the transparent polymer or the transparent metal third spacer layer film (200) as shown in FIG. 3. The CsPbCl$_3$ third emission layer film (205) can have a thickness of about 350 nm or 350 nm. The color of the CsPbCl$_3$ third emission layer film (205) can be blue.

In an embodiment of step 31, step 16 can be repeated for a transparent polymer or a transparent metal of a fourth spacer layer. The transparent polymer or the transparent metal of the fourth spacer layer can have a refractive index that is less than, greater than, or equal to a refractive index of the CsPbCl$_3$ third emission layer film (205). The CsPbCl$_3$ third emission layer film (205) can have a refractive index (n) of about 1.893 or 1.893. Any of the transparent polymer or the transparent metal, as indicated in Step 23, can be used for the fourth spacer layer.

In an embodiment of step 32, step 17 can be repeated for the transparent polymer or the transparent metal of the fourth spacer layer, thereby forming a transparent polymer or a transparent metal fourth spacer layer film (210) on the CsPbCl$_3$ third emission layer film (205) as shown in FIG. 3. The transparent polymer or the transparent metal fourth spacer layer film (210) can have a thickness of about 5 nm, 5 nm, or more. As another non-limiting embodiment, the thickness of the transparent polymer or the transparent metal fourth spacer layer film (210) can be 30 nm.

Optionally (if a transparent polymer or a transparent metal first spacer layer film (215) is desired), then steps 19-22 can be omitted and after step 18, any of the transparent polymer or the transparent metal, as indicated in step 23, can be used as a first spacer layer as long as the refractive index of the transparent polymer or the transparent metal is greater than or less than the refractive index of PMMA, which is n=1.48. In this regard, steps 2-3 can be repeated for the transparent polymer or the transparent metal of the first spacer layer, thereby forming a transparent polymer or a transparent metal first spacer layer film (215) on the substrate (110b). The transparent polymer or the transparent metal first spacer layer film (215) can have a thickness of about 5 nm, 5 nm, or more. As a non-limiting embodiment, the thickness of the transparent polymer or the transparent metal first spacer layer film (215) can be about 30 nm. Then, step 4 can be repeated for the formation of CsPbI$_{1.5}$Br$_{1.5}$ of the first emission layer. Next, step 5 can be repeated for the CsPbI$_{1.5}$Br$_{1.5}$ of the first emission layer. Afterward, step 6 can be repeated for the CsPbI$_{1.5}$Br$_{1.5}$ of the first emission layer, thereby forming the CsPbI$_{1.5}$Br$_{1.5}$ first emission layer film (185) on the transparent polymer or a transparent metal first spacer layer film (215). The CsPbI$_{1.5}$Br$_{1.5}$ first emission layer film (185) can have a thickness of about 350 nm or 350 nm. The color of the CsPbI$_{1.5}$Br$_{1.5}$ first emission layer film (185) can be red. Thereafter, step 7 can be repeated for the substrate (110b) containing the CsPbI$_{1.5}$Br$_{1.5}$ first emission layer film (185) on the transparent polymer or a transparent metal first spacer layer film (215), thereby generating the same unexpected result as indicated in Step 7. Subsequently, steps 23-32 can be repeated. can be repeated, thereby generating the same thickness, color, and/or unexpected results as indicated in the respective steps.

However, if the transparent polymer or the transparent metal first spacer layer film (215) is not desired (omitted), then steps 18-32 can be conducted as indicated above.

All of the spacer layer films (215,190,200,210) as shown in FIG. 3 provide several benefits. Firstly, the spacer layer films (215,190,200,210) can serve as passivation and encapsulation layers for the emission layer films (185,195,205). Secondly, the spacer layer films (190,200) can prevent diffusion among different adjacent emission layer films (185,195,205). As a non-limiting example, if the transparent polymer or the transparent metal third spacer layer film (200) was omitted, then the CsPbCl$_3$ third emission layer film (205) can diffuse into the CsPbBr$_3$ second emission layer film (195) thereby resulting in formation of the CsPbCl$_{1.5}$Br$_{1.5}$.

In an embodiment, the photon excitation light (220) can pass through the spacer layer films (215,190,200,210) and the emission layer films (185,195,205) while also being uniformly absorbed by the emission layer films (185,195, 205). The absorbance of the photon excitation light (220) can cause excitation (i.e., electrons within the emission layer films (185,195,205) jumping to excited states) of the emission layer films (185,195,205). After the absorbing and the excitation steps, each one of the emission layer films (185, 195,205) can emit photons (i.e., the excited electrons return to lower energy states and emit photons) in the form of light (i.e., face emission light (225) and edge emission light (230)) (hereinafter, the face emission light (225) and the edge emission light (230) emitted by the emission layer films (185,195,205) will be referred as "emission lights (225/230)") in all directions at its emission wavelength.

Due to the nature of the asymmetrical waveguide structure (180) and because the refractive indexes of the spacer layer films (190,200,210,215) can be less than, greater than, or equal to the refractive indexes of the emission layer films (185,195,205), the incidence angles of the emission lights (225/230) with respect to the spacer layer films (190,200, 210,215) above and below each one of the emission layer films (185,195,205) can cause certain characteristics on the emission lights (225/230). When the emission lights (225/230) pass through the spacer layer films (190,200,210,215) and the emission layer films (185,195,205), the emission lights (225/230) follow Snell's law as described supra.

In this aspect, when the incidence angles of the emission lights (225/230) are zero with respect to the spacer layer films (190,200,210,215) above and below each one of the emission layer films (185,195,205), the emission lights (225/230) can pass through the spacer layer films (190,200, 210,215) and the emission layer films (185,195,205) without changing its direction and regardless of the refractive indexes of all the mentioned films thereby resulting in the face emission light (225) as shown in FIG. 3. Corresponding to this embodiment, the edge emission light (230) emitted by the emission layer films (185,195,205) can be weakened while being directed along the path of the face emission light (225).

Conversely, when the incidence angles of the emission lights (225/230) are greater than zero with respect to the spacer layer films (190,200,210,215) above and below each one of the emission layer films (185,195,205), the emission lights (225/230) can have three different routes depending on the difference of refraction indexes of the spacer layer films (190,200,210,215) and the emission layer films (185, 195,205) and the incidence angles of the emission lights (225/230).

According to a first route in a non-limiting embodiment, the emission lights (225/230) can pass through the spacer layer films (190,200,210,215) and the emission layer films (185,195,205) with changed angle. According to an alternative second route in another non-limiting embodiment, the emission lights (225/230) can propagate along the interfaces (i.e., critical angle) of the spacer layer films (190,200,210, 215) and the emission layer films (185,195,205) toward the edges of the emission layer films (185,195,205) thereby resulting in an edge emission light (230) as shown in FIG. 3. Corresponding to this embodiment, the face emission light (225) emitted by the emission layer films (185,195, 205) can be weakened while being directed along the path of the edge emission light (230). According to another alternative third route in a further non-limiting embodiment, the emission lights (225/230) can be reflected within the spacer layer films (190,200,210,215) and the emission layer films (185,195,205) (i.e., total internal inflection) and propagate along the latter toward the edges of the emission layer films (185,195,205) thereby resulting in the edge emission light (230). Corresponding to this embodiment, the face emission light (225) emitted by the emission layer films (185,195, 205) can be weakened while being directed along the path of the edge emission light (230). Since the refractive indexes of all the spacer layer films (190,200,210,215) are lower than the refractive indexes of all the emission layer films (185, 195,205) as mentioned above, a strong waveguiding effect can be achieved thereby resulting in an edge emission light (230).

Multi-Wavelengths Laser

Figure 4:
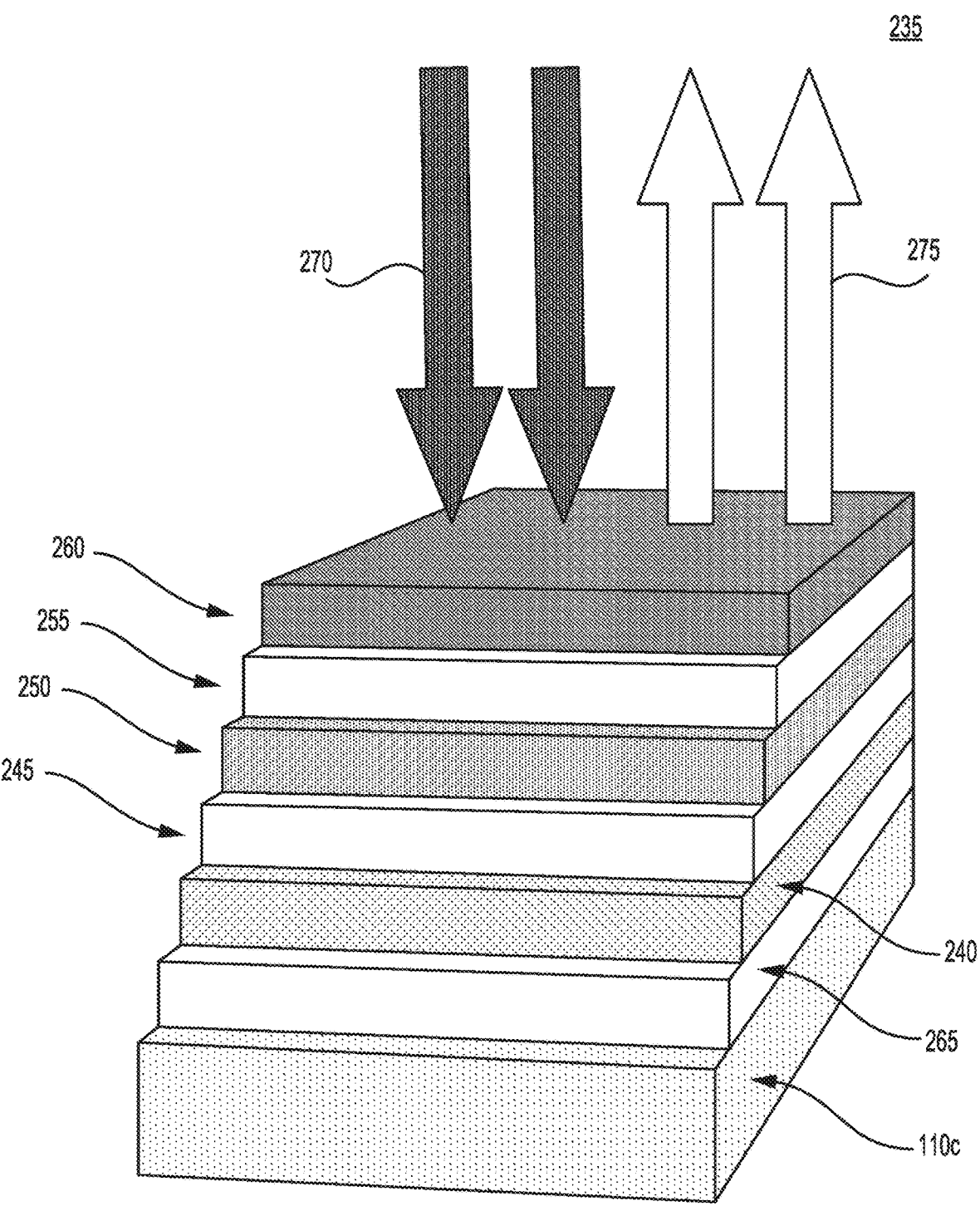
FIG. 4 depicts multi-wavelengths laser for an optoelectronic device.

In an embodiment, the method and the thermal evaporation vacuum chamber system (100) can also be used to manufacture a multi-wavelengths laser (235), as shown in FIG. 4, for an optoelectronic device. In this regard, the method can begin with step 33 of obtaining a new substrate (110c) and repeating step 1. The new substrate (110c) can be made of the same material as the substrate (110a) or the substrate (110b) in step 1 or step 18, respectively, or of a different material as listed in step 1.

In an embodiment of step 34, after the substrate (110c) was loaded, step 4 can be repeated for the formation of $CsPbI_{1.5}Br_{1.5}$ of the first emission layer (excluding a formation of a PMMA first spacer layer film).

In an embodiment of step 35, step 5 can be repeated for the $CsPbI_{1.5}Br_{1.5}$ of the first emission layer.

In an embodiment of step 36, step 6 can be repeated for the $CsPbI_{1.5}Br_{1.5}$ of the first emission layer, thereby forming the $CsPbI_{1.5}Br_{1.5}$ first emission layer film (240) on the substrate (110c). The $CsPbI_{1.5}Br_{1.5}$ first emission layer film (240) can have a thickness of about 350 nm or 350 nm. The color of the $CsPbI_{1.5}Br_{1.5}$ first emission layer film (240) can be red.

In an embodiment of step 37, step 7 can be repeated for the substrate (110c) containing only the $CsPbI_{1.5}Br_{1.5}$ first emission layer film (240), thereby generating the same unexpected result as indicated in Step 7.

In an embodiment of step 38, step 8 can be repeated for a transparent polymer or a transparent metal of a second spacer layer. The transparent polymer or the transparent metal of the second spacer layer can have a refractive index that is greater than or equal to a refractive index of the $CsPbI_{1.5}Br_{1.5}$ first emission layer film (240). The $CsPbI_{1.5}Br_{1.5}$ first emission layer film (240) can have a refractive index (n) of about 2.1 or 2.1. The transparent polymer or the transparent metal having the respective refractive indexes can be selected from the list indicated in step 23.

In an embodiment of step 39, step 9 can be repeated for the transparent polymer or the transparent metal of the second spacer layer, thereby forming a transparent polymer or a transparent metal second spacer layer film (245) on the $CsPbI_{1.5}Br_{1.5}$ first emission layer film (240) as shown in FIG. 4. The transparent polymer or the transparent metal second spacer layer film (245) can have a thickness of about 5 nm, 5 nm, or more. As a non-limiting embodiment, the transparent polymer or the transparent metal second spacer layer film (245) can have a thickness of 30 nm.

Unexpectedly, it was found that when the thickness of the transparent polymer or the transparent metal second spacer layer film (245) was at 30 nm, halide chemical compounds from adjacent emission layer films (i.e., $CsPbI_{1.5}Br_{1.5}$ first emission layer film (240) and $CsPbBr_3$ second emission layer film (250) as described herein) were prevented from mixing with each other.

In an embodiment of step 40, step 10 can be repeated for the $CsPbBr_3$ of the second emission layer.

In an embodiment of step 41, step 11 can be repeated for the $CsPbBr_3$ of the second emission layer, thereby forming the $CsPbBr_3$ second emission layer film (250) on the transparent polymer or the transparent metal second spacer layer film (245) as shown in FIG. 4. The $CsPbBr_3$ second emission layer film (250) can have a thickness of about 350 nm or 350 nm. The color of the $CsPbBr_3$ second emission layer film (250) can be green.

In an embodiment of step 42, step 12 can be repeated for a transparent polymer or a transparent metal of a third spacer layer. The transparent polymer or the transparent metal of the third spacer layer can have a refractive index that is greater than or equal to a refractive index of the $CsPbBr_3$ second emission layer film (250). The $CsPbBr_3$ second emission layer film (250) can have a refractive index (n) of about 2.029 or 2.029. Any of the transparent polymer or the transparent metal, as indicated in Step 23, can be used for the third spacer layer.

In an embodiment of step 43, step 13 can be repeated for the transparent polymer or the transparent metal of the third spacer layer, thereby forming a transparent polymer or a transparent metal third spacer layer film (255) on the $CsPbBr_3$ second emission layer film (250) as shown in FIG. 4. The transparent polymer or the transparent metal third spacer layer film (255) can have a thickness of about 5 nm, 5 nm, or more. In a non-limiting embodiment, the transparent polymer or the transparent metal third spacer layer film (255) can have a thickness of 30 nm.

Unexpectedly, it was found that when the thickness of the transparent polymer or the transparent metal third spacer layer film (255) was at 30 nm, halide chemical compounds from adjacent emission layer films (e.g., $CsPbBr_3$ second emission layer film (250) and CsPbCl$_3$ third emission layer film (260) as described herein) were prevented from mixing with each other.

In another non-limiting embodiment, the formation of the transparent polymer or the transparent metal third spacer layer film (255) can be the last step of the process to obtain a multi-wavelengths laser having two emission layers (240, 250) as shown in FIG. 4. Alternatively, the process can continue with step 44 as described herein.

In an embodiment of step 44, step 14 can be repeated for the CsPbCl$_3$ of the third emission layer.

In an embodiment of step 45, step 15 can be repeated for the CsPbCl$_3$ of the third emission layer, thereby forming the CsPbCl$_3$ third emission layer film (260) on the transparent polymer or the transparent metal third spacer layer film (255) as shown in FIG. 4. The CsPbCl$_3$ third emission layer film (260) can have a thickness of about 350 nm or 350 nm. The color of the CsPbCl$_3$ third emission layer film (260) can be blue.

Optionally (if a transparent polymer or a transparent metal first spacer layer film (265) is desired), steps 34-37 can be omitted and after step 33, any of the transparent polymer or the transparent metal, as indicated in step 23, can be used as a first spacer layer as long as the refractive index of the transparent polymer or the transparent metal is greater than or less than the refractive index of PMMA, which is n=1.48. In this regard, steps 2-3 can be repeated for the transparent polymer or the transparent metal of the first spacer layer, thereby forming a transparent polymer or a transparent metal first spacer layer film (265) on the substrate (110c). The transparent polymer or the transparent metal first spacer layer film (265) can have a thickness of about 5 nm, 5 nm, or more. As a non-limiting embodiment, the thickness of the transparent polymer or the transparent metal first spacer layer film (265) can be 30 nm. Then, step 4 can be repeated for the formation of CsPbI$_{1.5}$Br$_{1.5}$ of the first emission layer. Next, step 5 can be repeated for the CsPbI$_{1.5}$Br$_{1.5}$ of the first emission layer. Afterward, step 6 can be repeated for the CsPbI$_{1.5}$Br$_{1.5}$ of the first emission layer, thereby forming the CsPbI$_{1.5}$Br$_{1.5}$ first emission layer film (240) on the transparent polymer or a transparent metal first spacer layer film (265). The CsPbI$_{1.5}$Br$_{1.5}$ first emission layer film (240) can have a thickness of about 350 nm. The color of the CsPbI$_{1.5}$Br$_{1.5}$ first emission layer film (240) can be red. Thereafter, step 7 can be repeated for the substrate (110c) containing the CsPbI$_{1.5}$Br$_{1.5}$ first emission layer film (240) on the transparent polymer or the transparent metal first spacer layer film (265), thereby generating the same unexpected result as indicated in Step 7. Subsequently, steps 38-45 can be repeated, thereby generating the same thickness, color, and/or unexpected results as indicated in the respective steps.

However, if the transparent polymer or the transparent metal first spacer layer film (265) is not desired (omitted), then steps 33-45 can be conducted as indicated above.

All of the spacer layer films (265,245,255) as shown in FIG. 4 provide several benefits. Firstly, the spacer layer films (265,245,255) can serve as passivation and encapsulation layers for the emission layer films (240,250,260). Secondly, the spacer layer films (245,255) can prevent diffusion among different adjacent emission layer films (240,250,260). As a non-limiting example, if the transparent polymer or the transparent metal third spacer layer film (255) was omitted, then the CsPbCl$_3$ third emission layer film (260) can diffuse into the CsPbBr$_3$ second emission layer film (250) thereby resulting in formation of the CsPbCl$_{1.5}$Br$_{1.5}$.

In an embodiment, the photon excitation light (270) can pass through the spacer layer films (245,255,265) and the emission layer films (240,250,260) while also being uniformly absorbed by the emission layer films (240,250,260). The absorbance of the photon excitation light (270) can cause excitation (i.e., electrons within the emission layer films (240,250,260) jumping to excited states) of the emission layer films (240,250,260). After the absorbing and the excitation steps, each one of the emission layer films (240, 250,260) can emit photons (i.e., the excited electrons return to lower energy states and emit photons) in the form of light (i.e., face emission light (275)) in all directions at its emission wavelength.

Due to the refractive indexes of the spacer layer films (245,255,265) being greater than or equal to the refractive indexes of the emission layer films (240,250,260), the incidence angle of the face emission light (275) with respect to the spacer layer films (245,255,265) above and below each one of the emission layer films (240,250,260) can cause certain characteristics on the face emission light (275). When the face emission light (275) passes through the spacer layer films (245,255,265) and the emission layer films (240,250,260), the face emission light (275) follows Snell's law as described supra.

In this context, when the incidence angle of the face emission light (275) is zero and greater than zero with respect to the spacer layer films (245,255,265) above and below each one of the emission layer films (240,250,260), the face emission light (275) can pass through the spacer layer films (245,255,265) and the emission layer films (240,250,260) without changing its direction. According to this embodiment, most of the face emission light (275) can be emitted upward and against the direction of the photon excitation light (270) thereby resulting in the face emission light (275) as shown in FIG. 4.

In an embodiment, the three-dimensional halide perovskite can have a formula ABX$_3$: wherein A can be selected from the group consisting of methylammonium (CH$_3$NH$_3$$^+$), formamidinium (CH(NH$_2$)$_2$$^+$), cesium (Cs$^+$), rubidium (Rb$^+$), potassium (K$^+$), and a combination thereof; wherein B can be selected from the group consisting of lead (Pb$^{2+}$), tin (Sn$^{2+}$), germanium (Ge$^{2+}$), bismuth (Bi$^{3+}$), antimony (Sb$^{3+}$), and a combination thereof; and wherein X can be selected from the group consisting of iodide (I$^-$), bromide (Br$^-$), chloride (Cl$^-$), fluoride (F$^-$), and a combination thereof.

In an embodiment, the two-dimensional halide perovskite can have formulas R$_2$A$_{n-1}$B$_n$X$_{3n+1}$, and/or DA$_{n-1}$B$_n$X$_{3n+1}$: wherein R can be selected from the group consisting of butylammonium (BA), butylammonium (C$_4$H$_9$NH$_3$$^+$), phenethylamine (PEA), phenethylammonium (C$_6$H$_5$C$_2$H$_4$NH$_3$$^+$), octylammonium (OA), C$_8$H$_{17}$NH$_3$$^+$, hexylammonium (HA), C$_6$H$_{13}$NH$_3$$^+$, benzylammonium (BZA), aminobenzyl (C$_6$H$_5$CH$_2$NH$_3$$^+$), cyclohexylammonium (C$_6$H$_{13}$N), C$_6$H$_{11}$NH$_3$$^+$, and a combination thereof; wherein D can be selected from the group consisting of 1,4-butanediammonium (C$_4$H$_{14}$N$_2$$^{+2}$), NH$_3$(CH$_2$)$_4$NH$_3$, 1,3-propanediammonium (PDA), NH$_3$(CH$_2$)$_3$NH$_3$, ethylenediammonium (C$_2$H$_8$N$_2$), NH$_3$(CH$_2$)$_2$NH$_3$, 1,6-hexanediamine (HDA), NH$_3$(CH$_2$)$_6$NH$_3$, and a combination thereof; wherein A can be selected from the group consisting of methylammonium (CH$_3$NH$_3$$^+$), formamidinium (CH(NH$_2$)$_2$$^+$), cesium (Cs$^+$), rubidium (Rb$^+$), potassium (K$^+$), and a combination thereof; wherein B can be selected from the group consisting of lead (Pb$^{2+}$), tin (Sn$^{2+}$), germanium (Ge$^{2+}$), bismuth (Bi$^{3+}$), antimony (Sb$^{3+}$), and a combination thereof; and wherein X can be selected from the group consisting of iodide (I⁻), bromide (Br⁻), chloride (Cl⁻), fluoride (F⁻), and a combination thereof.

Figure 5:
FIG. 5 depicts the normalized photoluminescence (PL) intensity as a function of photon energy.

Based on the formulas $ABX_3$, $R_2A_{n-1}B_nX_{3n+1}$, and $DA_{n-1}B_nX_{3n+1}$, emission wavelength of the halide perovskites for all the emission layers (150,160,170,185,195,205,240,250, 260) can be modified by carefully adjusting one or more constituents of the A-site, B-site, and X-site. As a non-limiting example, using different mixing ratios for X-site (i.e., Cl/Br and Br/I), the emission wavelength of 21 methylammonium (MA) lead halide perovskite compositions for all the emission layers (150,160, 170, 185, 195,205,240,250, 260) can be tuned from 390 nm to 780 nm as shown in FIG. 5.

For example, $CsPbCl_{1.5}Br_{1.5}$ has a band gap of 2.80 eV and can emit at around 450 nm. So, compositional engineering considers this embodiment as being useful in a method for tuning the bandgap and other photoelectronic properties of the perovskite. Various structures can be obtained, and light will be produced over spectral wavelengths ranging from infrared (IR) to ultraviolet (UV). Emission wavelength selection can be obtained through the band gap engineering of perovskite thin film since the emission wavelength is proportional inversely with band gap. In this respect, by changing the ratio between Cl and Br for the X-site, the band gap (hence the emission wavelength) can be tuned as shown in Table 1 below.

TABLE 1

| Composition CsPbBr(x)Cl(3-x) | Bandgap (eV) | Emission Wavelength (nm) |
| --- | --- | --- |
| CsPbCl(3) (when x = 0) | 3.0 | 410 |
| CsPbBr(0.5)Cl(2.5) (when x = 0.5) | 2.9 | 440 |
| CsPbBr(1)Cl(2) (when x = 1) | 2.8 | 470 |
| CsPbBr(1.5)Cl(1.5) (when x = 1.5) | 2.7 | 500 |
| CsPbBr(2)Cl(1) (when x =2) | 2.6 | 530 |
| CsPbBr(2.5)Cl(0.5) (when x = 2.5) | 2.5 | 560 |
| CsPbBr(3) (when x = 3.0) | 2.4 | 530 |

Figure 6:
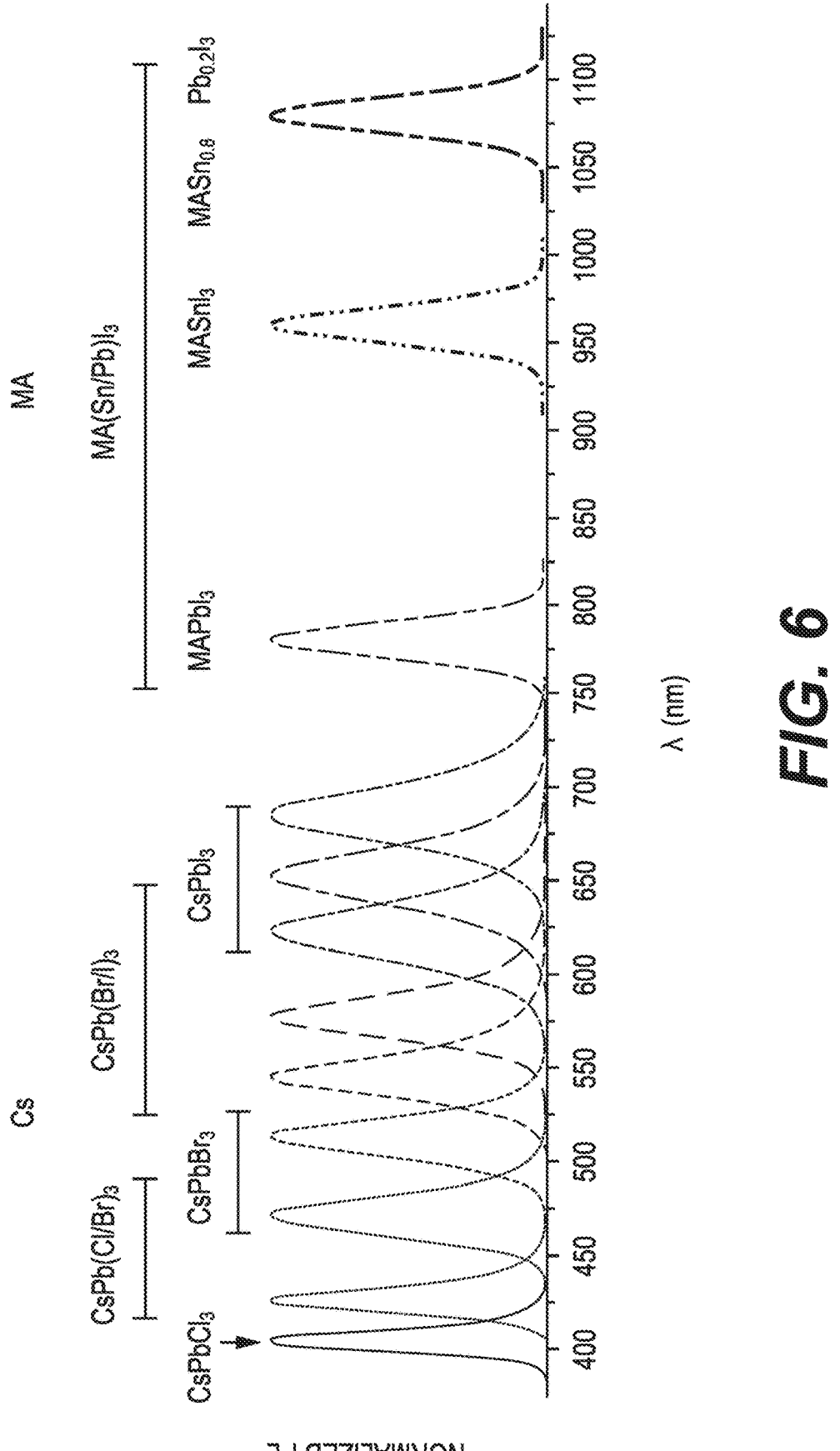
FIG. 6 depicts normalized photoluminescence (PL) intensity as a function of wavelength.

In an embodiment, FIG. 6 depicts the emission spectrum of 9 cesium lead halide perovskite compositions including the emission spectrum of $MAPbI_3$, $MASnI_3$, and $MASn_{0.8}Pb_{0.2}I_3$, where the MA is the A-site, Sn/Pb is the B-site, and $I_3$ is the X-site in the $ABX_3$ structure.

In an embodiment, thickness optimization can be controlled by adjusting an amount of the halide perovskite material for the respective emission layers (i.e., 150,160, 170,185,195,205,240,250,260) loaded into the tungsten boat (125) within the vacuum chamber (120) of the thermal evaporation vacuum chamber system (100).

In an embodiment, doping level for each of the emission layers (i.e., 150,160,170,185,195,205,240,250,260) can be controlled by adjusting the ratios of the different halide perovskite compositions (i.e., $CsPbI_{1.5}Br_{1.5}$, $CsPbBr_3$, $CsPbCl_3$) relative to each other.

When a halide perovskite thin film is optically pumped (i.e., by a laser), it can exhibit amplified spontaneous emission (ASE) or lasing behavior. The "threshold intensity" refers to the minimum pumping energy required to achieve ASE. Since the thickness of each layer plays a major role in the absorption, reabsorption, and energy transfer; fine-tuning the thickness of each of the emission layers (i.e., 150,160,170,185,195,205,240,250,260) should be achieved via controlling the composition quantity of the respective emission layers (i.e., 150,160,170,185,195,205,240,250, 260).

Figure 7:
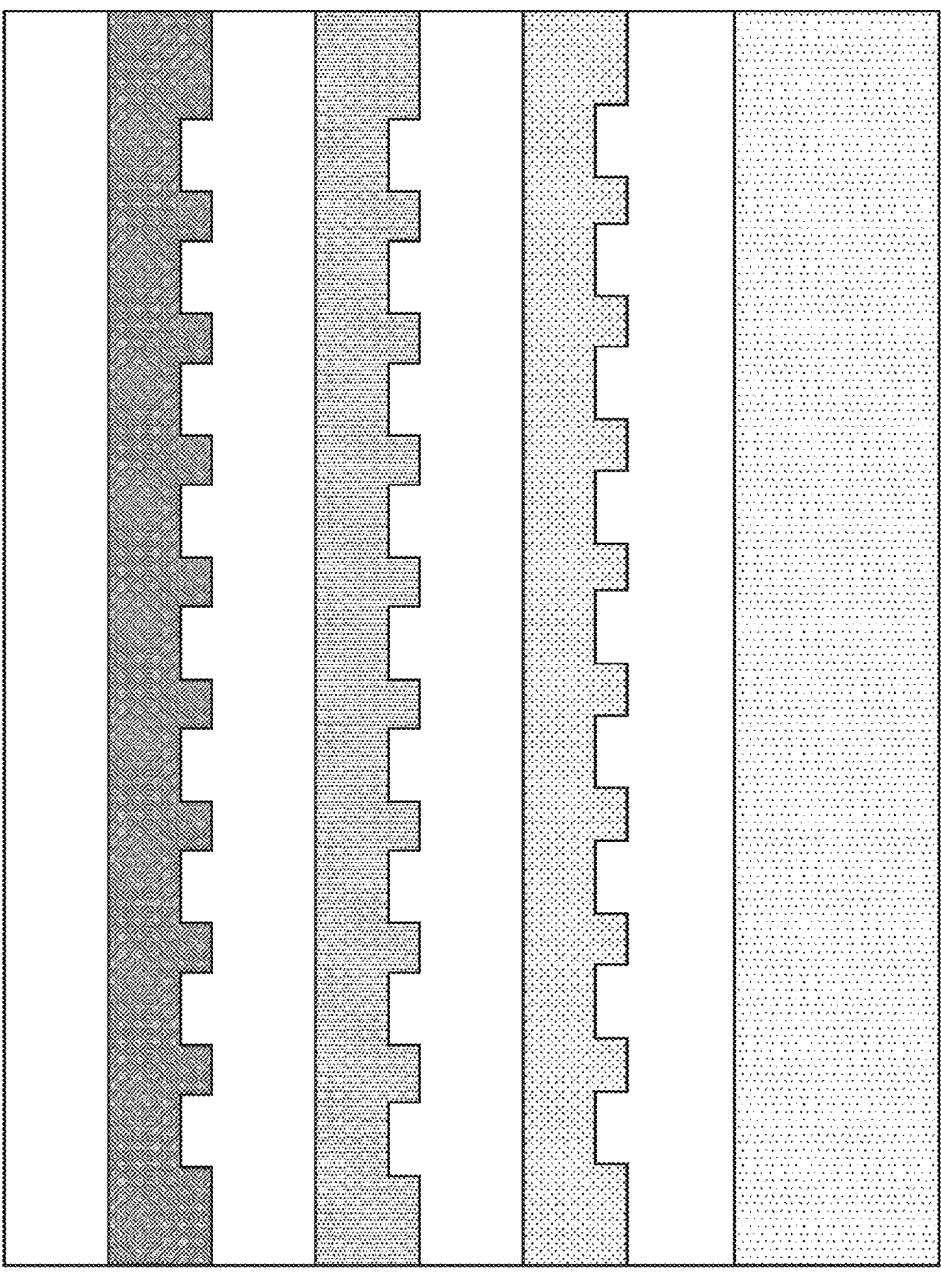
FIG. 7 depicts a distributed feedback (DFB) design.

Using perovskite layers with distributed feedback (DFB) design, as shown FIG. 7, is expected to help with wavelength selectivity and line width narrowing. The distributed feedback (DFB) design in FIG. 7 can play a role in achieving wavelength selectivity (or fine-tune the wavelength) and narrowing the line width (see FIG. 10). DFB resonators can create a periodic structure within the perovskites layer. The grating pattern (like the one in FIG. 7) can introduce a periodic modulation in the refractive index of the material. When light propagates through the DFB structure, it can experience constructive or destructive interference depending on its wavelength. Only specific wavelengths that satisfy the Bragg condition (where the grating period matches an integer multiple of the wavelength) are likely to be allowed to resonate. The constructive interference of light at these wavelengths ensures that only a narrow range of wavelengths is amplified and emitted. As a result, the perovskite emits light at these specific wavelengths and therefore the line width will be narrow. Line width refers to the width of the emission peak in the spectra of FIG. 9. It is usually quantified by measuring the Full Width at Half Maximum (FWHM) of the emission peak.

In an embodiment, the perovskite layers with distributed feedback (DFB) design can be produced by applying etching on the formed spacer layer films (i.e., PMMA first spacer layer film (145) after step 3, PMMA second spacer layer film (155) after step 8, PMMA third spacer layer film (165) after step 12) or on the formed emission layer films (i.e., $CsPbI_{1.5}Br_{1.5}$ first emission layer film (150) after step 7, $CsPbBr_3$ second emission layer film (160) after step 11, $CsPbCl_3$ third emission layer film (170) after step 15).

Figure 8:
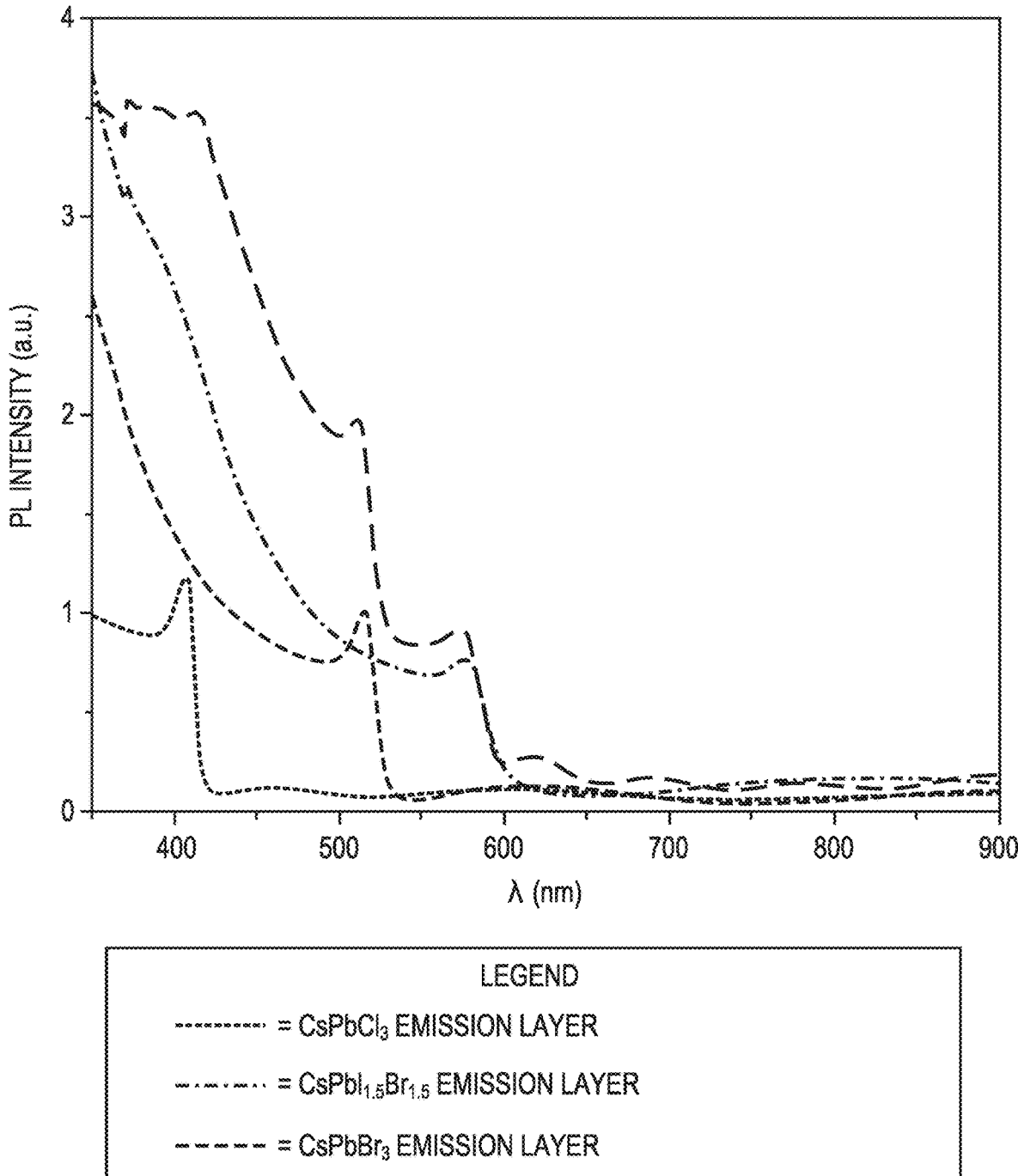
FIG. 8 depicts photoluminescence (PL) intensity as a function of wavelengths for the $CsPbBr_{1.5}I_{1.5}$, the $CsPbBr_3$, and the $CsPbCl_3$ emission layers.

As depicted in FIG. 8, the halide perovskite of all the emission layers (i.e., 150,160,170,185,195,205,240,250, 260) were grown independently of each other and the spacer layers (i.e., 155,165, 190,200,245,255) effectively prevented the formation of mixed halide emission perovskite from the respective layers (i.e., 150,160,170,185,195,205,240,250, 260). As shown in FIG. 8, the $CsPbBr_{1.5}I_{1.5}$ emission layer, the $CsPbBr_3$ emission layer, and the $CsPbCl_3$ emission layer were individually deposited on separate substrates with no other emission layer or spacer layer. As can be seen from FIG. 8, the absorbance spectra of each of the emission layers ($CsPbBr_{1.5}I_{1.5}$, the $CsPbBr_3$, and the $CsPbCl_3$) were almost identical to the layered RGB, with no new distinct peaks appearing, which proves that the spacer layers (i.e., 155, 165,190,200,245,255) effectively prevented the formation of mixed halide perovskite from the respective emission layers (i.e., 150,160,170,185, 195,205,240,250,260). As a non-limiting example, if the third spacer layer (i.e., 170,205,260) is omitted in the layered RBG sample, the $CsPbCl_3$ emission layer (with absorption onset at 407 nm) will mix with the $CsPbBr_3$ emission layer (absorption onset at 515 nm), thereby resulting in one layer of the $CsPbCl_{1.5}Br_{1.5}$ emission layer (with absorption onset at around 460 nm). This aligns with the unexpected results as indicated in the above-mentioned steps 9, 13, 24, 28, 39, and 43.

Figure 9:
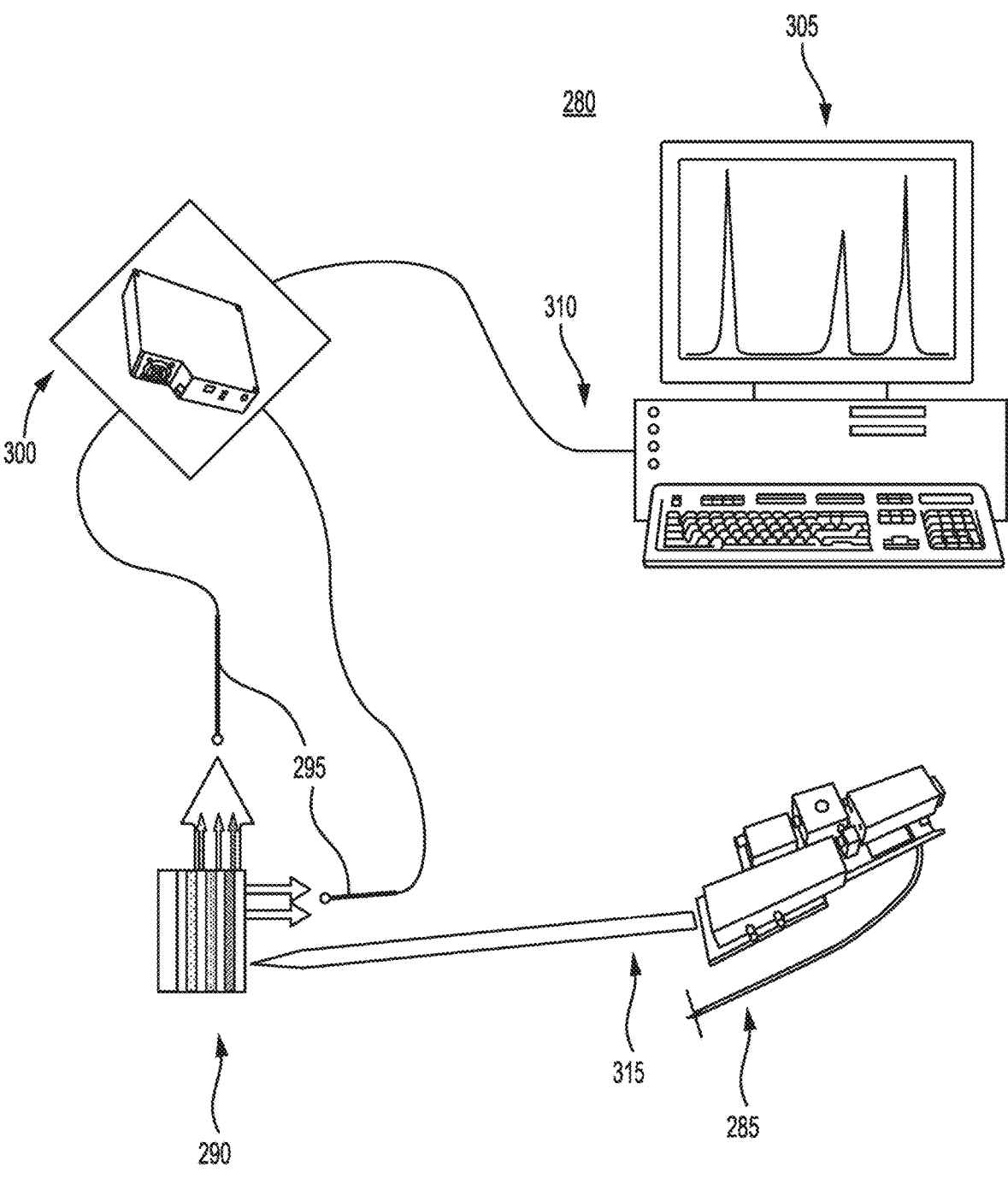
FIG. 9 depicts a system for generating photoluminescence spectra from a sample.
Figure 10:
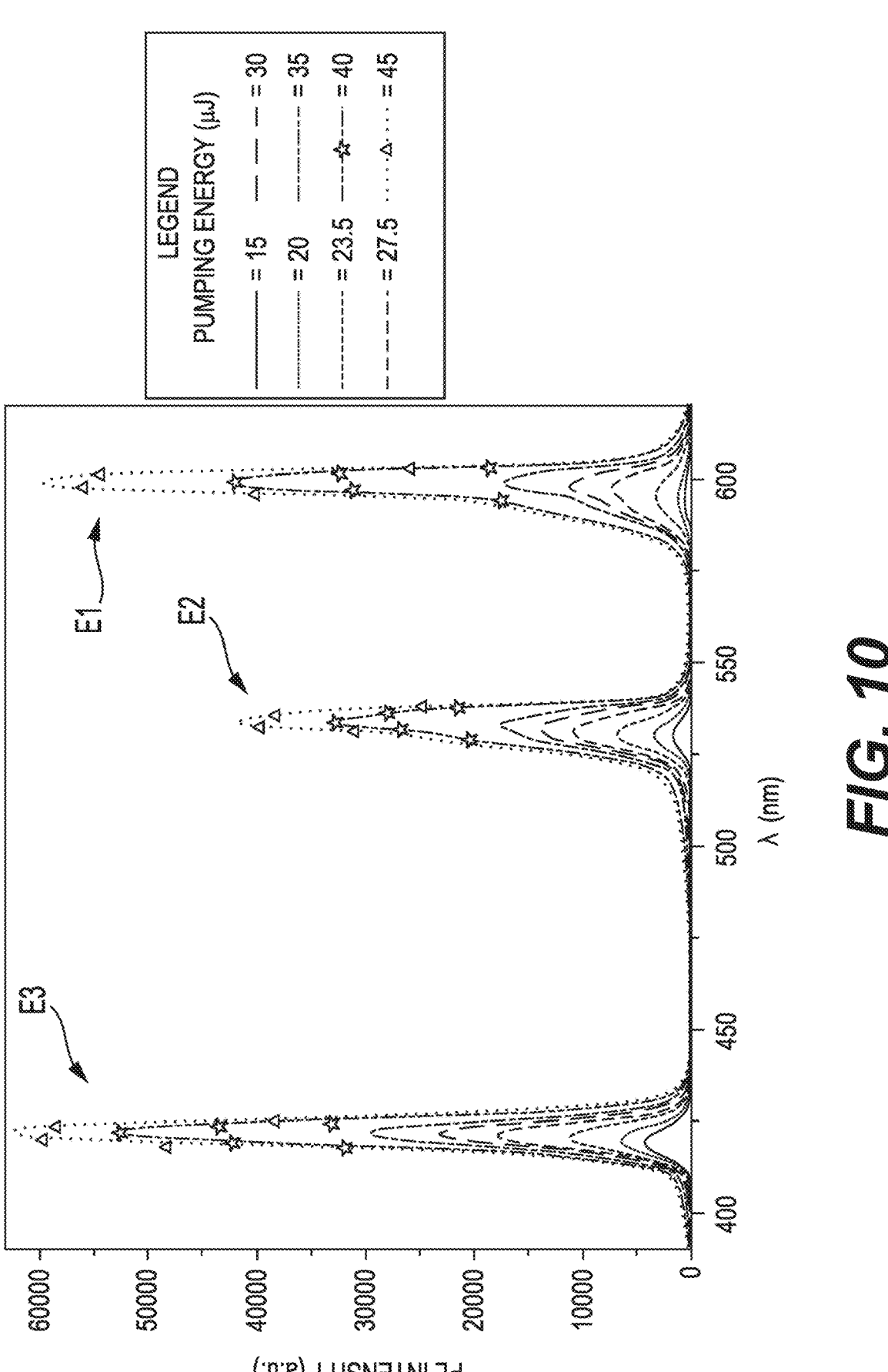
FIG. 10 depicts photoluminescence (PL) intensity as a function of pumping energy and wavelengths for the $CsPbBr_{1.5}I_{1.5}$, the $CsPbBr_3$, and the $CsPbCl_3$ emission layers.

FIG. 9 depicts a system (280) which can include Nd:YAG laser (285), a sample (290) (i.e., the symmetrical waveguide RGB white laser (105), the asymmetrical waveguide structure (180), and the multi-wavelengths laser (235)), optical fibers (295) which are connected to face emission and edge emission at one end of the optical fibers (295) and connected to a spectrograph (300) at another end of the optical fibers (295), and a computer (305) which is connected to the spectrograph (300) via a cable (310). In an embodiment, the Nd:YAG laser (285) can be configured to pump or excite 355 nm laser beam (315) to the sample (290). Depending on the type of sample (290) used (i.e., the symmetrical waveguide RGB white laser (105), the asymmetrical waveguide structure (180), and the multi-wavelengths laser (235)), the laser beam (315), which is a photon excitation light similar to the photon excitation lights (320,220,270) as shown in FIGS. 2-4, can pass through the spacer layer films and the emission layer films of the respective mentioned sample (290) to emit as a face emission light (face emission lights (325,225,275) as shown in FIGS. 2-4) and/or an edge emission light (edge emission lights (330,230) as shown in FIGS. 2-3) as described herein. The signals from the face emission light and/or edge emission light can be received by the optical fibers (295) at the one end. The signals can be sent to the spectrograph (300) for analyzing the spectrum of lights from the sample (290) and separating the spectrum of lights into its spectral components. The spectral components are then sent to the computer (305) via the cable (310) for displaying the photoluminescence spectra collected. In a non-limiting embodiment, the photoluminescence spectra showed three separated peaks of about 600 nm, about 533 nm, and about 420 nm for the $CsPbBr_{1.5}I_{1.5}$ emission layer (E1), the $CsPbBr_3$ emission layer (E2), and the $CsPbCl_3$ emission layer (E3), respectively, as depicted in FIG. 10. As the pumping energy increases, the photoluminescence (PL) intensity of each of the emission layers (E1,E2,E3) increased. At certain levels (threshold pumping or energy), the full width at half maximum (FWHM) decreases sharply, indicating that the emission originates from an amplified spontaneous emission (ASE) process rather than from spontaneous emission. In other words, at certain energy levels, the emission becomes more intense and narrower, thereby indicating that the emission is due to ASE rather than from spontaneous emission.

The amplified spontaneous emission (ASE) regime may be in a state of producing a pulse of coherent light from a gain medium under optical pumping without feedback from which stimulated emission (laser) can be produced. In other words, lasing is an ASE followed with feedback. ASE emerge when an intense light (not less than a threshold value) excites a considerable portion of gain medium located in the ground state into a certain higher excited state such that deexcitation can occur at once to produce giant coherent optical pulse called ASE with very narrow line width. Below the threshold energy densities, an incoherent emission (spontaneous emission) could take place with relatively broad line width. Above the threshold, this broad emission gets narrowed as the pumping energy increases. This ASE process may serve as a crucial and fundamental step for evaluating the suitability of a material for lasing applications, where the optical feedback can then be added via suitable reflection arrangement.

Figure 11:
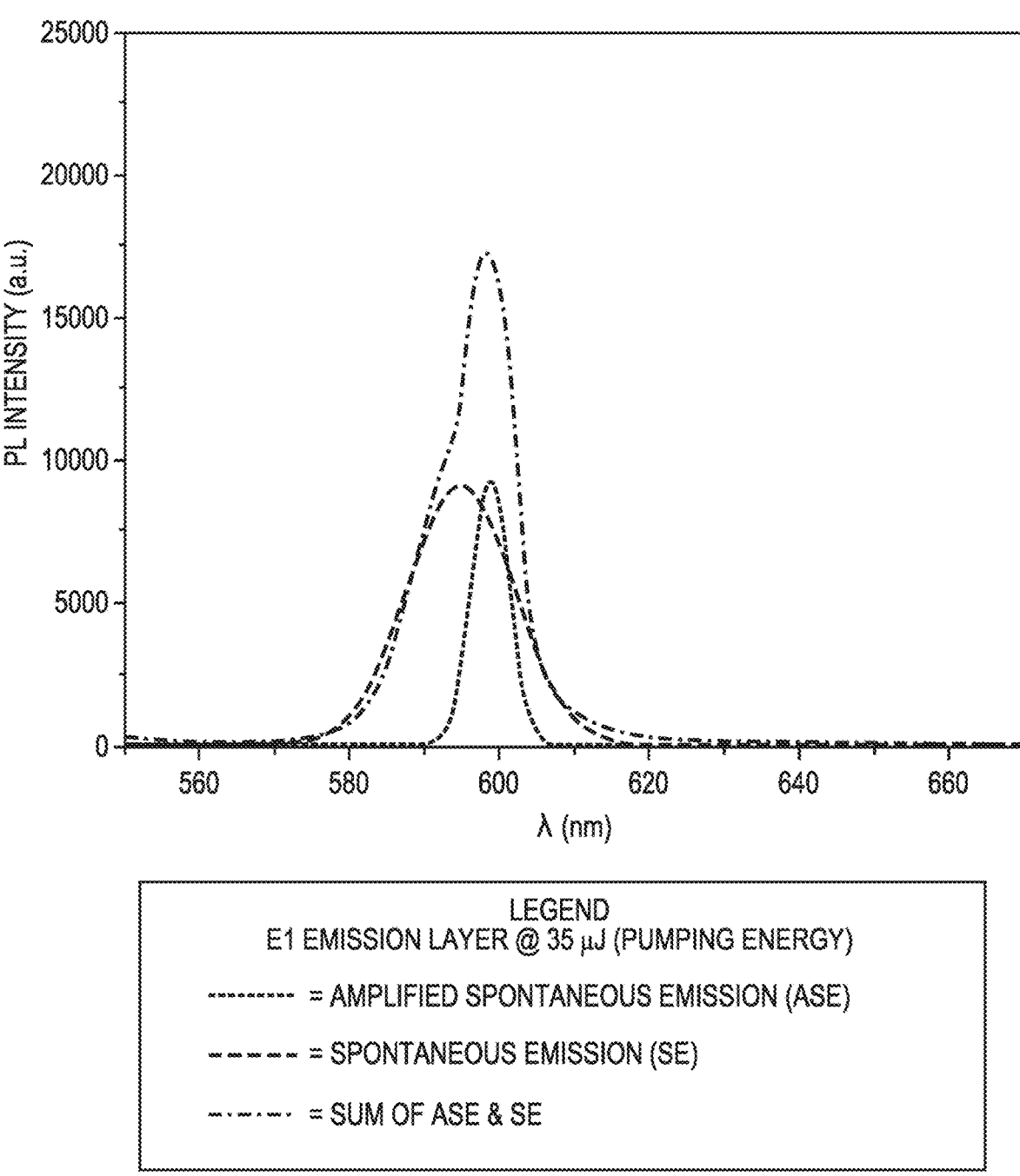
FIG. 11 depicts photoluminescence (PL) intensity as a function of wavelength for the $CsPbBr_{1.5}I_{1.5}$ emission layer.

FIG. 11 depicts the $CsPbBr_{1.5}I_{1.5}$ emission layer (E1) (peak at about 600 nm) at 35 μJ pumping energy (which is above the threshold), which is also shown in FIG. 10, with the ASE and the spontaneous emission to the resultant spectra. Spontaneous emission typically shows broader spectral peaks, while ASE exhibits narrower peak. As the pumping energy increases, as shown in FIG. 10, the ASE increases rapidly because of the amplification process.

Figure 12:
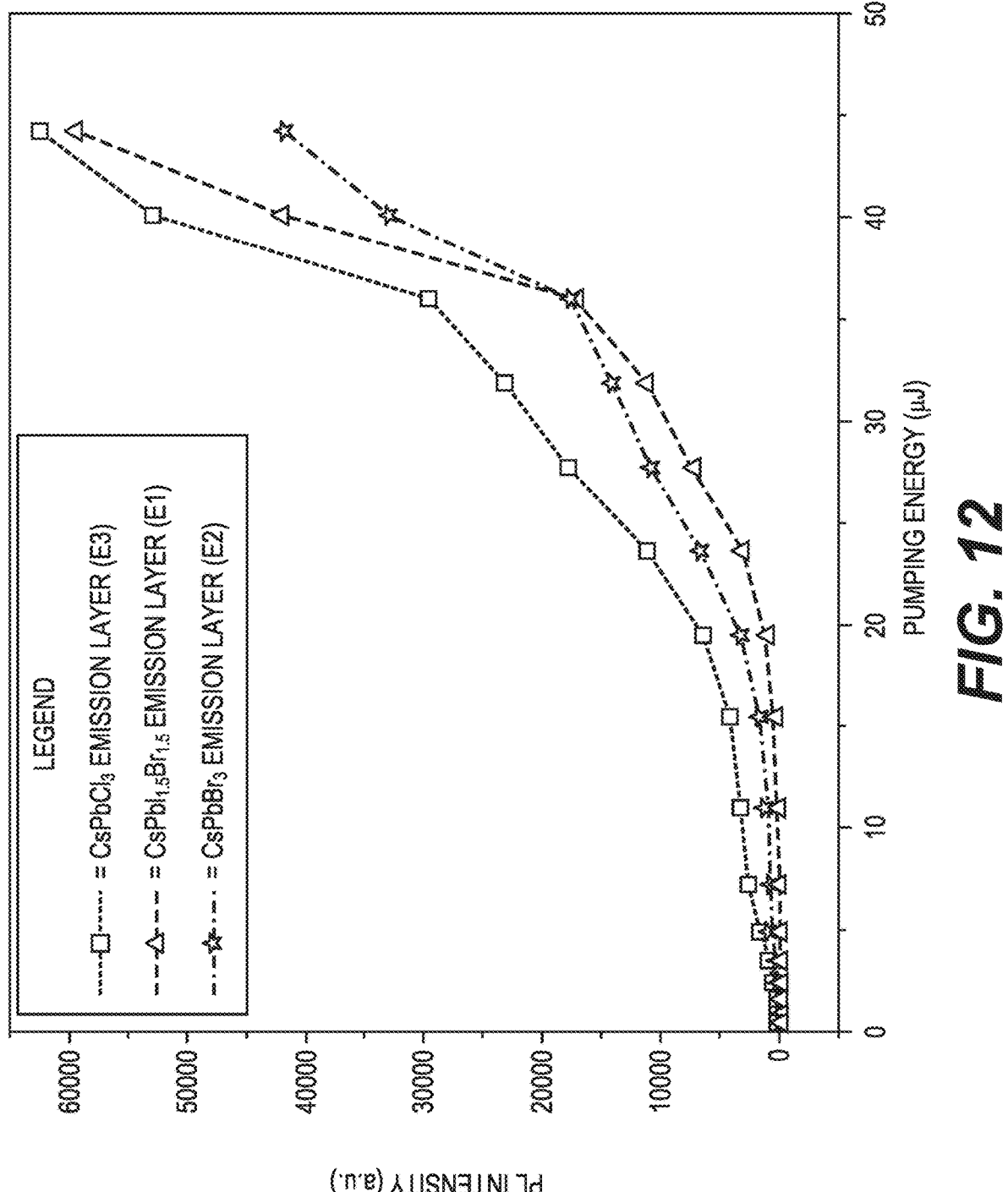
FIG. 12 depicts the photoluminescence peaks intensity as a function of pumping energy for the $CsPbBr_{1.5}I_{1.5}$, the $CsPbBr_3$, and the $CsPbCl_3$ emission layers.

FIG. 12 depicts the photoluminescence peaks intensity as a function of pumping energy. As shown in the figure, the photoluminescence (PL) intensity increases sharply as the pumping energy level exceeds the threshold energy. This proves the presence of ASE regime for the $CsPbBr_{1.5}I_{1.5}$ emission layer (E1), the $CsPbBr_3$ emission layer (E2), and the $CsPbCl_3$ emission layer (E3).

The following examples illustrate the present teachings.

EXAMPLES

Example 1

Preparation of a Symmetrical Waveguide RGB White Laser for an Optoelectronic Device The process of preparing symmetrical waveguide for an optoelectronic device using halide perovskite layers was conducted using the following steps.

Step 1: A substrate was provided and cleaned via a cleaning method. The cleaning method can include sonicating the substrate by an ultrasonicator in soapy water for about 15 min, followed by sonication in water alone for about 15 min. The substrate can then be sequentially ultrasonicated in acetone and isopropyl alcohol (IPA) for about 15 min each and allowed to dry. Then the substrate can be subjected to UV-Ozone irradiation. The cleaned substrate was then loaded onto a substrate holder within a vacuum chamber of a thermal evaporation vacuum chamber system. The substrate can be made of glass, sapphire, quartz, mica, silicon, plastics (e.g., polyethylene terephthalate (PET), polyethylene naphthalate (PEN), polyimide (PI), polycarbonate (PC), polyethersulfone (PES), metal foils (e.g., stainless steel, copper, titanium, nickel, tungsten, molybdenum, silver), ceramics (e.g., alumina, silicon nitride), and a combination thereof.

Step 2: After the cleaned substrate was loaded, polymethyl methacrylate (PMMA) of the first spacer layer was loaded into a tungsten boat within the vacuum chamber of the thermal evaporation vacuum chamber system.

Step 3: Pressure within the vacuum chamber of the thermal evaporation vacuum chamber system was reduced to about $10^{-4}$ mbar or less, while a current of the tungsten boat was increased to about 17 amps or more. Due to the reduced pressure and the heating of the PMMA of the first spacer layer via the current adjustment, the PMMA within the tungsten boat was evaporated, as evaporation plume, towards the substrate to deposit a first spacer layer of the PMMA on the substrate thereby forming a PMMA first spacer layer film on the substrate. The PMMA first spacer layer film had a thickness of 30 nm.

Step 4: After the formation of the PMMA first spacer layer film, perovskite materials, which include polybenzimidazole ($PbI_2$), cesium iodide (CsI), lead bromide ($PbBr_2$), and cesium bromide (CsBr), were separately premixed in equal molar ratios. Then the premixed perovskite materials were combined to form $CsPbI_{1.5}Br_{1.5}$ of a first emission layer, which is a halide perovskite.

Step 5: Step 2 was repeated for the $CsPbI_{1.5}Br_{1.5}$ of the first emission layer (PMMA was excluded from this step).

Step 6: The same pressure reduction and the current adjustment of Step 3 was repeated for the $CsPbI_{1.5}Br_{1.5}$ of the first emission layer, resulting in the $CsPbI_{1.5}Br_{1.5}$ within the tungsten boat being evaporated, as evaporation plume, towards the substrate to deposit a first emission layer of the $CsPbI_{1.5}Br_{1.5}$ on the substrate thereby forming a $CsPbI_{1.5}Br_{1.5}$ first emission layer film on the PMMA first spacer layer film. The $CsPbI_{1.5}Br_{1.5}$ first emission layer film had a thickness of about 350 nm. The color of the $CsPbI_{1.5}Br_{1.5}$ first emission layer film was red.

Step 7: The substrate, containing the $CsPbI_{1.5}Br_{1.5}$ first emission layer film on the PMMA first spacer layer film, was removed from the vacuum chamber of the thermal evaporation vacuum chamber system. Afterward, the substrate was placed on a hotplate to thermally anneal the $CsPbI_{1.5}Br_{1.5}$ first emission layer film at a temperature of 165° C. for 10 minutes. After the annealing process, the substrate was reloaded onto the substrate holder. The color of the $CsPbI_{1.5}Br_{1.5}$ first emission layer film was red.

Step 8: After the formation of the $CsPbI_{1.5}Br_{1.5}$ first emission layer film, Step 2 was repeated for a PMMA of a second spacer layer.

Step 9: The same pressure reduction and the current adjustment of Step 3 was repeated for the PMMA of the second spacer layer, resulting in the PMMA within the tungsten boat being evaporated, as evaporation plume, towards the substrate to deposit the second spacer layer of the PMMA on the substrate thereby forming a PMMA second spacer layer film on the $CsPbI_{1.5}Br_{1.5}$ first emission layer film. The PMMA second spacer layer film had a thickness of 30 nm.

Step 10: After the formation of the PMMA second spacer layer film, Step 2 was repeated for $CsPbBr_3$ of a second emission layer, which is a halide perovskite (PMMA was excluded from this step).

Step 11: The same pressure reduction and the current adjustment of Step 3 was repeated for the $CsPbBr_3$ of the second emission layer, resulting in the $CsPbBr_3$ within the tungsten boat being evaporated, as evaporation plume, towards the substrate to deposit the second emission layer of the $CsPbBr_3$ on the substrate thereby forming a $CsPbBr_3$ second emission layer film on the PMMA second spacer layer film. The $CsPbBr_3$ second emission layer film had a thickness of about 350 nm. The color of the $CsPbBr_3$ second emission layer film was green.

Step 12: After the formation of the $CsPbBr_3$ second emission layer film, Step 2 was repeated for a PMMA of a third spacer layer.

Step 13: The same pressure reduction and the current adjustment of Step 3 was repeated for the PMMA of the third spacer layer, resulting in the PMMA within the tungsten boat being evaporated, as evaporation plume, towards the substrate to deposit the third spacer layer of the PMMA on the substrate thereby forming a PMMA third spacer layer film on the $CsPbBr_3$ second emission layer film. The PMMA third spacer layer film had a thickness of 30 nm.

Step 14: After the formation of the PMMA third spacer layer film, Step 2 was repeated for $CsPbCl_3$ of a third emission layer, which is a halide perovskite (PMMA was excluded from this step).

Step 15: The same pressure reduction and the current adjustment of Step 3 was repeated for the $CsPbCl_3$ of the third emission layer, resulting in the $CsPbCl_3$ within the tungsten boat being evaporated, as evaporation plume, towards the substrate to deposit the third emission layer of the $CsPbCl_3$ on the substrate thereby forming a $CsPbCl_3$ third emission layer film on the PMMA third spacer layer film. The $CsPbCl_3$ third emission layer film had a thickness of about 350 nm. The color of the $CsPbCl_3$ third emission layer film was blue.

Step 16: After the formation of the $CsPbCl_3$ third emission layer film, Step 2 was repeated for a PMMA of a fourth spacer layer.

Step 17: The same pressure reduction and the current adjustment of Step 3 was repeated for the PMMA of the fourth spacer layer, resulting in the PMMA within the tungsten boat being evaporated, as evaporation plume, towards the substrate to deposit the fourth spacer layer of the PMMA on the substrate thereby forming a PMMA fourth spacer layer film on the $CsPbCl_3$ third emission layer film. The PMMA fourth spacer layer film had a thickness of 30 nm.

Example 2

Preparation of an Asymmetrical Waveguide Structure for an Optoelectronic Device

The process of preparing an asymmetrical waveguide for an optoelectronic device using halide perovskite layers was conducted using the following steps.

Step 18: Step 1 was repeated using a new substrate. The new substrate can be made of the same material as the substrate in Step 1 or of a different material as listed in Step 1. Step 19: After the cleaned substrate was loaded, Step 4 was repeated for the formation of $CsPbI_{1.5}Br_{1.5}$ of the first emission layer (excluding the formation of the PMMA first spacer layer film).

Step 20: Step 5 was repeated for the $CsPbI_{1.5}Br_{1.5}$ of the first emission layer.

Step 21: Step 6 was repeated for the $CsPbI_{1.5}Br_{1.5}$ of the first emission layer, thereby forming the $CsPbI_{1.5}Br_{1.5}$ first emission layer film on the substrate. The $CsPbI_{1.5}Br_{1.5}$ first emission layer film had a thickness of about 350 nm. The color of the $CsPbI_{1.5}Br_{1.5}$ first emission layer film was red.

Step 22: Step 7 was repeated for the substrate containing only the $CsPbI_{1.5}Br_{1.5}$ first emission layer film, thereby generating the same unexpected result as indicated in Step 7.

Step 23: Step 8 was repeated for a transparent polymer or a transparent metal of a second spacer layer. The transparent polymer or the transparent metal of the second spacer layer can have a refractive index that is less than, greater than, or equal to a refractive index of the $CsPbI_{1.5}Br_{1.5}$ first emission layer film. The $CsPbI_{1.5}Br_{1.5}$ first emission layer film had a refractive index (n) of about 2.1. The transparent polymer was selected from the group consisting of polymethyl methacrylate (PMMA), polystyrene (PS), polycarbonate (PC), polyvinylidene fluoride (PVDF), epoxy resin, polyethylene oxide (PEO), and a combination thereof. The refractive indexes (n) of the PMMA, PS, PC, PVDF, epoxy resin, and the PEO were 1.48, 1.59, 1.58-1.59, 1.42-1.47, 1.50-1.60, and 1.45-1.50, respectively. The transparent metal was selected from the group consisting of titanium dioxide ($TIO_2$), indium tin oxide (ITO), aluminum-doped zinc oxide (AZO), zirconium dioxide ($ZrO_2$), silicon dioxide ($SiO_2$), silicon monoxide (SiO), aluminum oxide ($Al_2O_3$), tin oxide ($SnO_2$), indium oxide ($In_2O_3$), tantalum pentoxide ($Ta_2O_5$), zinc sulfide (ZnS), zinc oxide (ZnO), magnesium oxide (MgO), and a combination thereof. The refractive indexes (n) of the $TIO_2$, ITO, AZO, $ZrO_2$, SiO2, SiO, $Al_2O_3$, $SnO_2$, $In_2O_3$, $Ta_2O_5$, ZnS, ZnO, MgO were 2.4, 1.8270, 1.8284, 2.1588, 1.4585, 1.7100, 1.77, 1.5-2.6, 1.8-2.0, 2.1, 2.356, 2.008, 1.736, respectively.

Step 24: Step 9 was repeated for the transparent polymer or the transparent metal of the second spacer layer, thereby forming a transparent polymer or a transparent metal second spacer layer film on the $CsPbI_{1.5}Br_{1.5}$ first emission layer film. The transparent polymer or the transparent metal second spacer layer film had a thickness of 30 nm.

Step 25: Step 10 was repeated for the $CsPbBr_3$ of the second emission layer.

Step 26: Step 11 was repeated for the $CsPbBr_3$ of the second emission layer, thereby forming the $CsPbBr_3$ second emission layer film on the transparent polymer or the transparent metal second spacer layer film. The $CsPbBr_3$ second emission layer film had a thickness of about 350 nm. The color of the $CsPbBr_3$ second emission layer film was green.

Step 27: Step 12 was repeated for a transparent polymer or a transparent metal of a third spacer layer. The transparent polymer or the transparent metal of the third spacer layer can have a refractive index that is less than, greater than, or equal to a refractive index of the $CsPbBr_3$ second emission layer film. The $CsPbBr_3$ second emission layer film had a refractive index (n) of about 2.029. Any of the transparent polymer or the transparent metal, as indicated in Step 23, can be used for the third spacer layer.

Step 28: Step 13 was repeated for the transparent polymer or the transparent metal of the third spacer layer, thereby forming a transparent polymer or a transparent metal third spacer layer on the $CsPbBr_3$ second emission layer film. The transparent polymer or the transparent metal third spacer layer film had a thickness of 30 nm.

Step 29: Step 14 was repeated for the $CsPbCl_3$ of the third emission layer.

Step 30: Step 15 was repeated for the $CsPbCl_3$ of the third emission layer, thereby forming the $CsPbCl_3$ third emission layer film on the transparent polymer or the transparent metal third spacer layer film. The $CsPbCl_3$ third emission layer film had a thickness of about 350 nm. The color of the $CsPbCl_3$ third emission layer film was blue.

Step 31: Step 16 was repeated for a transparent polymer or a transparent metal of a fourth spacer layer. The transparent polymer or the transparent metal of the fourth spacer layer can have a refractive index that is less than, greater than, or equal to a refractive index of the $CsPbCl_3$ third emission layer film. The $CsPbCl_3$ third emission layer film had a refractive index (n) of about 1.893. Any of the transparent polymer or the transparent metal, as indicated in Step 23, can be used for the fourth spacer layer.

Step 32: Step 17 was repeated for the transparent polymer or the transparent metal of the fourth spacer layer, thereby forming a transparent polymer or a transparent metal fourth spacer layer film on the $CsPbCl_3$ third emission layer film. The transparent polymer or the transparent metal fourth spacer layer film had a thickness of 30 nm.

Example 3

Multi-Wavelengths Laser for an Optoelectronic Device

The process of preparing a multi-wavelengths laser for an optoelectronic device using halide perovskite layers was conducted using the following steps.

Step 33: Step 1 was repeated using a new substrate. The new substrate can be made of the same material as the substrate in Step 1 or Step 18, or of a different material as listed in Step 1.

Step 34: After the cleaned substrate was loaded, Step 4 was repeated for the formation of $CsPbI_{1.5}Br_{1.5}$ of the first emission layer (excluding the formation of the PMMA first spacer layer film).

Step 35: Step 5 was repeated for the $CsPbI_{1.5}Br_{1.5}$ of the first emission layer.

Step 36: Step 6 was repeated for the $CsPbI_{1.5}Br_{1.5}$ of the first emission layer, thereby forming the $CsPbI_{1.5}Br_{1.5}$ first emission layer film on the substrate. The $CsPbI_{1.5}Br_{1.5}$ first emission layer film had a thickness of about 350 nm. The color of the $CsPbI_{1.5}Br_{1.5}$ first emission layer film was red.

Step 37: Step 7 was repeated for the substrate containing only the $CsPbI_{1.5}Br_{1.5}$ first emission layer film, thereby generating the same unexpected result as indicated in Step 7.

Step 38: Step 8 was repeated for a transparent polymer or a transparent metal of a second spacer layer. The transparent polymer or the transparent metal of the second spacer layer can have a refractive index that is greater than or equal to a refractive index of the $CsPbI_{1.5}Br_{1.5}$ first emission layer film. The $CsPbI_{1.5}Br_{1.5}$ first emission layer film had a refractive index (n) of about 2.1. Any of the transparent polymer or the transparent metal, as indicated in Step 23, can be used for the second spacer layer.

Step 39: Step 9 was repeated for the transparent polymer or the transparent metal of the second spacer layer, thereby forming a transparent polymer or a transparent metal second spacer layer film on the $CsPbI_{1.5}Br_{1.5}$ first emission layer film. The transparent polymer or the transparent metal second spacer layer film had a thickness of 30 nm.

Step 40: Step 10 was repeated for the $CsPbBr_3$ of the second emission layer.

Step 41: Step 11 was repeated for the $CsPbBr_3$ of the second emission layer, thereby forming the $CsPbBr_3$ second emission layer film on the transparent polymer or the transparent metal second spacer layer film. The $CsPbBr_3$ second emission layer film had a thickness of about 350 nm. The color of the $CsPbBr_3$ second emission layer film was green.

Step 42: Step 12 was repeated for a transparent polymer or a transparent metal of a third spacer layer. The transparent polymer or the transparent metal of the third spacer layer can have a refractive index that is greater than or equal to a refractive index of the $CsPbBr_3$ second emission layer film. The $CsPbBr_3$ second emission layer film had a refractive index (n) of about 2.029. Any of the transparent polymer or the transparent metal, as indicated in Step 23, can be used for the third spacer layer.

Step 43: Step 13 was repeated for the transparent polymer or the transparent metal of the third spacer layer, thereby forming a transparent polymer or a transparent metal third spacer layer on the $CsPbBr_3$ second emission layer film. The transparent polymer or the transparent metal third spacer layer film had a thickness of 30 nm.

Step 44: Step 14 was repeated for the $CsPbCl_3$ of the third emission layer.

Step 45: Step 15 was repeated for the $CsPbCl_3$ of the third emission layer, thereby forming the $CsPbCl_3$ third emission layer film on the transparent polymer or the transparent metal third spacer layer film. The $CsPbCl_3$ third emission layer film had a thickness of about 350 nm. The color of the $CsPbCl_3$ third emission layer film was blue.

It is to be understood that the method for manufacturing an optoelectronic device using halide perovskite layers is not limited to the specific embodiments described above, but encompasses any and all embodiments within the scope of the generic language of the following claims enabled by the embodiments described herein, or otherwise shown in the drawings or described above in terms sufficient to enable one of ordinary skill in the art to make and use the claimed subject matter.

The invention claimed is:

1. A method for manufacturing an optoelectronic device using halide perovskite layers, the method comprising:
   providing a substrate;
   depositing a first spacer layer on the substrate;
   depositing a first emission layer on the first spacer layer;
   depositing a second spacer layer on the first emission layer;
   depositing a second emission layer on the second spacer layer;

depositing a third spacer layer on the second emission layer;

depositing a third emission layer on the third spacer layer;

depositing a fourth spacer layer on the third emission layer;

wherein the first emission layer, the second emission layer, and the third emission layer each comprise a halide perovskite layer;

wherein the halide perovskite layer of each of the first emission layer, the second emission layer, and the third emission layer comprises a three-dimensional halide perovskite, a two-dimensional halide perovskite, or a combination thereof;

wherein the steps of depositing the first spacer layer, the first emission layer, the second spacer layer, the second emission layer, the third spacer layer, the third emission layer, and the fourth spacer layer are each independently conducted via a process of thermal evaporation using a thermal evaporation vacuum chamber system;

wherein the substrate is loaded onto a substrate holder of the thermal evaporation vacuum chamber system;

wherein each of the first spacer layer, the second spacer layer, the third spacer layer, and the fourth spacer layer comprise polymethyl methacrylate; and wherein the halide perovskite layer of each of the first emission layer, the second emission layer, and the third emission layer comprises $CsPbI_{1.5}Br_{1.5}$, $CsPbBr_3$, and $CsPbCl_3$, respectively;

further comprising the steps of:

(a) sequentially and separately loading each of the polymethyl methacrylate of the first spacer layer, the $CsPbI_{1.5}Br_{1.5}$ of the first emission layer, the polymethyl methacrylate of the second spacer layer, the $CsPbBr_3$ of the second emission layer, the polymethyl methacrylate of the third spacer layer, the $CsPbCl_3$ of the third emission layer, and the polymethyl methacrylate of the fourth spacer layer into a tungsten boat of the thermal evaporation vacuum chamber system prior to the steps of depositing the respective layers; and (b) for each of the loaded polymethyl methacrylate of the first spacer layer, the $CsPbI_{1.5}Br_{1.5}$ of the first emission layer, the polymethyl methacrylate of the second spacer layer, the $CsPbBr_3$ of the second emission layer, the polymethyl methacrylate of the third spacer layer, the $CsPbCl_3$ of the third emission layer, and the polymethyl methacrylate of the fourth spacer layer, reducing a pressure within the thermal evaporation vacuum chamber system to about $10^{-4}$ mbar or less and increasing a current of the tungsten boat to about 17 amps or more to allow the respective layers within the tungsten boat to sequentially and separately evaporate toward the substrate thereby depositing:

the evaporated polymethyl methacrylate of the first spacer layer on the substrate to obtain a polymethyl methacrylate first spacer layer film on the substrate, the evaporated $CsPbI_{1.5}Br_{1.5}$ of the first emission layer on the polymethyl methacrylate first spacer layer film to obtain a $CsPbI_{1.5}Br_{1.5}$ first emission layer film on the polymethyl methacrylate first spacer layer film, the evaporated polymethyl methacrylate of the second spacer layer on the $CsPbI_{1.5}Br_{1.5}$ first emission layer film to obtain a polymethyl methacrylate second spacer layer film on the $CsPbI_{1.5}Br_{1.5}$ first emission layer film, the evaporated $CsPbBr_3$ of the second emission layer on the polymethyl methacrylate second spacer layer film to obtain a $CsPbBr_3$ second emission layer film on the polymethyl methacrylate second spacer layer film, the evaporated polymethyl methacrylate of the third spacer layer on the $CsPbBr_3$ second emission layer film to obtain a polymethyl methacrylate third spacer layer film on the $CsPbBr_3$ second emission layer film, the evaporated $CsPbCl_3$ of the third emission layer on the polymethyl methacrylate third spacer layer film to obtain a $CsPbCl_3$ third emission layer film on the polymethyl methacrylate third spacer layer film, and the evaporated polymethyl methacrylate of the fourth spacer layer on the $CsPbCl_3$ third emission layer film to obtain a polymethyl methacrylate fourth spacer layer film on the $CsPbCl_3$ third emission layer film.

2. The method for manufacturing an optoelectronic device of claim 1, further comprising:

prior to the step of loading the polymethyl methacrylate of the second spacer layer into the tungsten boat, removing the substrate containing the $CsPbI_{1.5}Br_{1.5}$ first emission layer film on the polymethyl methacrylate first spacer layer film from the thermal evaporation vacuum chamber system;

placing the substrate containing the $CsPbI_{1.5}Br_{1.5}$ first emission layer film on the polymethyl methacrylate first spacer layer film on a hotplate; and thermally annealing the $CsPbI_{1.5}Br_{1.5}$ first emission layer film at a temperature of about 165° C. or more for about 10 minutes or more.

3. A method for manufacturing an optoelectronic device using halide perovskite layers, the method comprising:

providing a substrate;

depositing a first spacer layer on the substrate;

depositing a first emission layer on the first spacer layer;

depositing a second spacer layer on the first emission layer;

depositing a second emission layer on the second spacer layer;

depositing a third spacer layer on the second emission layer;

depositing a third emission layer on the third spacer layer;

depositing a fourth spacer layer on the third emission layer;

wherein the first emission layer, the second emission layer, and the third emission layer each comprise a halide perovskite layer;

wherein the halide perovskite layer of each of the first emission layer, the second emission layer, and the third emission layer comprises a three-dimensional halide perovskite, a two-dimensional halide perovskite, or a combination thereof;

wherein the steps of depositing the first spacer layer, the first emission layer, the second spacer layer, the second emission layer, the third spacer layer, the third emission layer, and the fourth spacer layer are each independently conducted via a process of thermal evaporation using a thermal evaporation vacuum chamber system;

wherein the substrate is loaded onto a substrate holder of the thermal evaporation vacuum chamber system;

wherein each of the first spacer layer, the second spacer layer, the third spacer layer, and the fourth spacer layer comprise a transparent polymer or a transparent metal having a refractive index that is less than, greater than, or equal to a refractive index of each of the first emission layer, the second emission layer, and the third emission layer, respectively; and wherein the halide perovskite layer of each of the first emission layer, the second emission layer, and the third emission layer comprises $CsPbI_{1.5}Br_{1.5}$, $CsPbBr_3$, and $CsPbCl_3$, respectively;

further comprising the steps of:

(a) sequentially and separately loading each of the $CsPbI_{1.5}Br_{1.5}$ of the first emission layer, the transparent polymer or the transparent metal of the second spacer layer, the $CsPbBr_3$ of the second emission layer, the transparent polymer or the transparent metal of the third spacer layer, the $CsPbCl_3$ of the third emission layer, and the transparent polymer or the transparent metal of the fourth spacer layer into a tungsten boat of the thermal evaporation vacuum chamber system prior to the steps of depositing the respective layers; and (b) for each of the loaded $CsPbI_{1.5}Br_{1.5}$ of the first emission layer, the transparent polymer or the transparent metal of the second spacer layer, the $CsPbBr_3$ of the second emission layer, the transparent polymer or the transparent metal of the third spacer layer, the $CsPbCl_3$ of the third emission layer, and the transparent polymer or the transparent metal of the fourth spacer layer, reducing a pressure within the thermal evaporation vacuum chamber system to about $10^{-4}$ mbar or less and increasing a current of the tungsten boat to about 17 amps or more to allow the respective layers within the tungsten boat to sequentially and separately evaporate toward the substrate thereby depositing:

the evaporated $CsPbI_{1.5}Br_{1.5}$ of the first emission layer on the substrate to obtain a $CsPbI_{1.5}Br_{1.5}$ first emission layer film on the substrate, the evaporated transparent polymer or the evaporated transparent metal of the second spacer layer on the $CsPbI_{1.5}Br_{1.5}$ first emission layer film to obtain a transparent polymer or a transparent metal second spacer layer film on the $CsPbI_{1.5}Br_{1.5}$ first emission layer film, the evaporated $CsPbBr_3$ of the second emission layer on the transparent polymer or the transparent metal second spacer layer film to obtain a $CsPbBr_3$ second emission layer film on the transparent polymer or the transparent metal second spacer layer film, the evaporated transparent polymer or the evaporated transparent metal of the third spacer layer on the $CsPbBr_3$ second emission layer film to obtain a transparent polymer or a transparent metal third spacer layer film on the $CsPbBr_3$ second emission layer film, the evaporated $CsPbCl_3$ of the third emission layer on the transparent polymer or the transparent metal third spacer layer film to obtain a $CsPbCl_3$ third emission layer film on the transparent polymer or the transparent metal third spacer layer film, and the evaporated transparent polymer or the evaporated transparent metal of the fourth spacer layer on the $CsPbCl_3$ third emission layer film to obtain a transparent polymer or a transparent metal fourth spacer layer film on the $CsPbCl_3$ third emission layer film.

4. The method for manufacturing an optoelectronic device of claim 3, further comprising:

prior to the step of loading the polymethyl methacrylate of the second spacer layer into the tungsten boat, removing the substrate containing the $CsPbI_{1.5}Br_{1.5}$ first emission layer film from the thermal evaporation vacuum chamber system;

placing the substrate containing the $CsPbI_{1.5}Br_{1.5}$ first emission layer film on a hotplate; and thermally annealing the $CsPbI_{1.5}Br_{1.5}$ first emission layer film at a temperature range of about 165° C. or more for about 10 minutes or more.

5. A method for manufacturing an optoelectronic device using halide perovskite layers, the method comprising:

providing a substrate;

depositing a first spacer layer on the substrate;

depositing a first emission layer on the first spacer layer;

depositing a second spacer layer on the first emission layer;

depositing a second emission layer on the second spacer layer;

depositing a third spacer layer on the second emission layer;

depositing a third emission layer on the third spacer layer;

depositing a fourth spacer layer on the third emission layer;

wherein the first emission layer, the second emission layer, and the third emission layer each comprise a halide perovskite layer;

wherein the halide perovskite layer of each of the first emission layer, the second emission layer, and the third emission layer comprises a three-dimensional halide perovskite, a two-dimensional halide perovskite, or a combination thereof;

wherein the steps of depositing the first spacer layer, the first emission layer, the second spacer layer, the second emission layer, the third spacer layer, the third emission layer, and the fourth spacer layer are each independently conducted via a process of thermal evaporation using a thermal evaporation vacuum chamber system;

wherein the substrate is loaded onto a substrate holder of the thermal evaporation vacuum chamber system;

wherein each of the first spacer layer, the second spacer layer, the third spacer layer, and the fourth spacer layer comprise a transparent polymer or a transparent metal having a refractive index that is greater than or equal to a refractive index of each of the first emission layer and the second emission layer, respectively; and wherein the halide perovskite layer of each of the first emission layer, the second emission layer, and the third emission layer comprises $CsPbI_{1.5}Br_{1.5}$, $CsPbBr_3$, and $CsPbCl_3$, respectively;

(a) sequentially and separately loading each of the $CsPbI_{1.5}Br_{1.5}$ of the first emission layer, the transparent polymer or the transparent metal of the second spacer layer, the $CsPbBr_3$ of the second emission layer, the transparent polymer or the transparent metal of the third spacer layer, and the $CsPbCl_3$ of the third emission layer into a tungsten boat of the thermal evaporation vacuum chamber system prior to the steps of depositing the respective layers; and (b) for each of the loaded $CsPbI_{1.5}Br_{1.5}$ of the first emission layer, the transparent polymer or the transparent metal of the second spacer layer, the $CsPbBr_3$ of the second emission layer, the transparent polymer or the transparent metal of the third spacer layer, and the $CsPbCl_3$ of the third emission layer, reducing a pressure within the thermal evaporation vacuum chamber system to about $10^{-4}$ mbar or less and increasing a current of the tungsten boat to about 17 amps or more to allow the respective layers within the tungsten boat to sequentially and separately evaporate toward the substrate thereby depositing:

the evaporated $CsPbI_{1.5}Br_{1.5}$ of the first emission layer on the substrate to obtain a $CsPbI_{1.5}Br_{1.5}$ first emission layer film on the substrate, the evaporated transparent polymer or the evaporated transparent metal of the second spacer layer on the $CsPbI_{1.5}Br_{1.5}$ first emission layer film to obtain a transparent polymer or a transparent metal second spacer layer film on the $CsPbI_{1.5}Br_{1.5}$ first emission layer film, the evaporated $CsPbBr_3$ of the second emission layer on the transparent polymer or the transparent metal second spacer layer film to obtain a $CsPbBr_3$ second emission layer film on the transparent polymer or the transparent metal second spacer layer film, the evaporated transparent polymer or the evaporated transparent metal of the third spacer layer on the $CsPbBr_3$ second emission layer film to obtain a transparent polymer or a transparent metal third spacer layer film on the $CsPbBr_3$ second emission layer film, and the evaporated $CsPbCl_3$ of the third emission layer on the transparent polymer or the transparent metal third spacer layer film to obtain a $CsPbCl_3$ third emission layer film on the transparent polymer or the transparent metal third spacer layer film.

6. The method for manufacturing an optoelectronic device of claim 5, further comprising:

prior to the step of loading the polymethyl methacrylate of the second spacer layer into the tungsten boat, removing the substrate containing the $CsPbI_{1.5}Br_{1.5}$ first emission layer film from the thermal evaporation vacuum chamber system;

placing the substrate containing the $CsPbI_{1.5}Br_{1.5}$ first emission layer film on a hotplate; and thermally annealing the $CsPbI_{1.5}Br_{1.5}$ first emission layer film at a temperature range of about 165° C. or more for about 10 minutes or more.

* * * * *